(12) United States Patent
Konishi et al.

(10) Patent No.: US 12,080,352 B2
(45) Date of Patent: Sep. 3, 2024

(54) MEMORY SYSTEM CONTROLLING NONVOLATILE MEMORY

(71) Applicant: Kioxia Corporation, Tokyo (JP)

(72) Inventors: Kyoka Konishi, Yokohama Kanagawa (JP); Yasuyuki Ushijima, Yokohama Kanagawa (JP); Hisaki Niikura, Tokyo (JP); Eriko Akaihata, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 188 days.

(21) Appl. No.: 17/902,279

(22) Filed: Sep. 2, 2022

(65) Prior Publication Data
US 2023/0307061 A1 Sep. 28, 2023

(30) Foreign Application Priority Data
Mar. 22, 2022 (JP) .................. 2022-045555

(51) Int. Cl.
*G11C 16/16* (2006.01)
*G11C 16/08* (2006.01)
*G11C 16/34* (2006.01)
*G11C 29/52* (2006.01)

(52) U.S. Cl.
CPC .............. *G11C 16/16* (2013.01); *G11C 16/08* (2013.01); *G11C 16/3495* (2013.01); *G11C 29/52* (2013.01)

(58) Field of Classification Search
CPC ..... G11C 16/16; G11C 16/08; G11C 16/3495; G11C 29/52; G11C 29/028; G11C 29/42; G11C 2029/1202; G11C 16/10

USPC .................................................... 365/185.29
See application file for complete search history.

(56) References Cited

U.S. PATENT DOCUMENTS

| | | |
|---|---|---|
| 10,140,040 B1 | 11/2018 | Koudele et al. |
| 10,482,986 B2 | 11/2019 | Cheng et al. |
| 10,490,288 B1 | 11/2019 | Wang et al. |
| 10,521,140 B2 | 12/2019 | Koudele et al. |
| 10,698,636 B1 | 6/2020 | Liikanen |
| 11,495,310 B2 * | 11/2022 | Matranga ........... G11C 16/3445 |
| 2020/0004440 A1 | 1/2020 | Koudele et al. |
| 2020/0075111 A1 | 3/2020 | Sheperek et al. |
| 2020/0286567 A1 * | 9/2020 | Liikanen ............. G11C 11/5642 |
| 2020/0312419 A1 | 10/2020 | Sheperek et al. |
| 2022/0075562 A1 * | 3/2022 | Kurosawa ........... G06F 13/4282 |
| 2022/0164144 A1 * | 5/2022 | Cho ........................ G11C 7/22 |

* cited by examiner

*Primary Examiner* — Huan Hoang
*Assistant Examiner* — Minh Dinh
(74) *Attorney, Agent, or Firm* — Maier & Maier, PLLC

(57) ABSTRACT

According to one embodiment, each time the number of program/erase cycles of a block increases by a first number of times, a controller of a memory system measures the number of error bits of data read from a plurality of memory cells connected to each of a plurality of word lines. The controller identifies a word line group including a word line corresponding to the number of error bits which is greater than a threshold. The controller selects, based on an average number of error bits of the identified word line group, a parameter set to be applied to the identified word line group from a plurality of parameter sets. The controller changes, to the selected parameter set, a parameter set defining a program operation for the identified word line group.

10 Claims, 16 Drawing Sheets

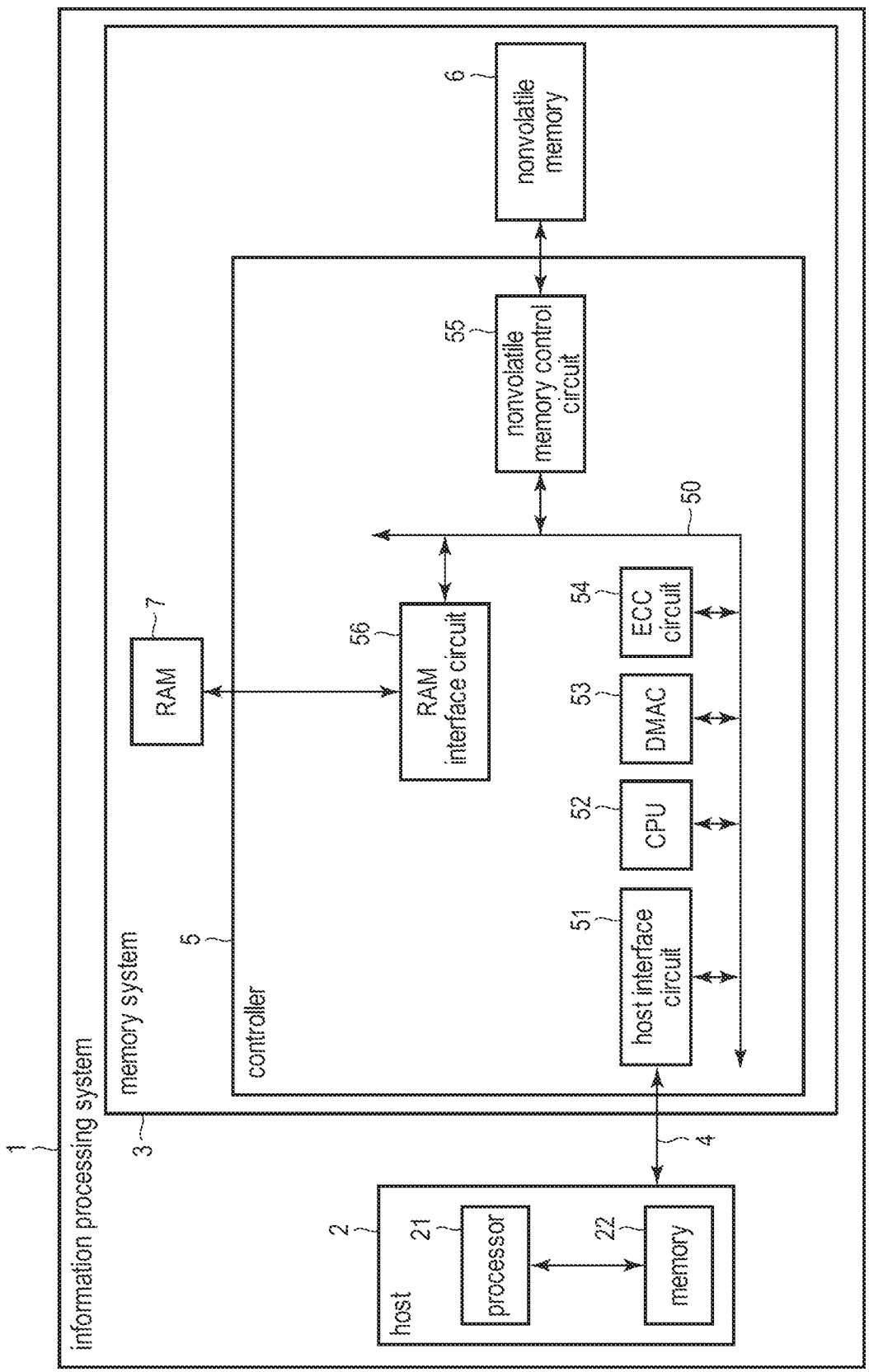
F I G. 1

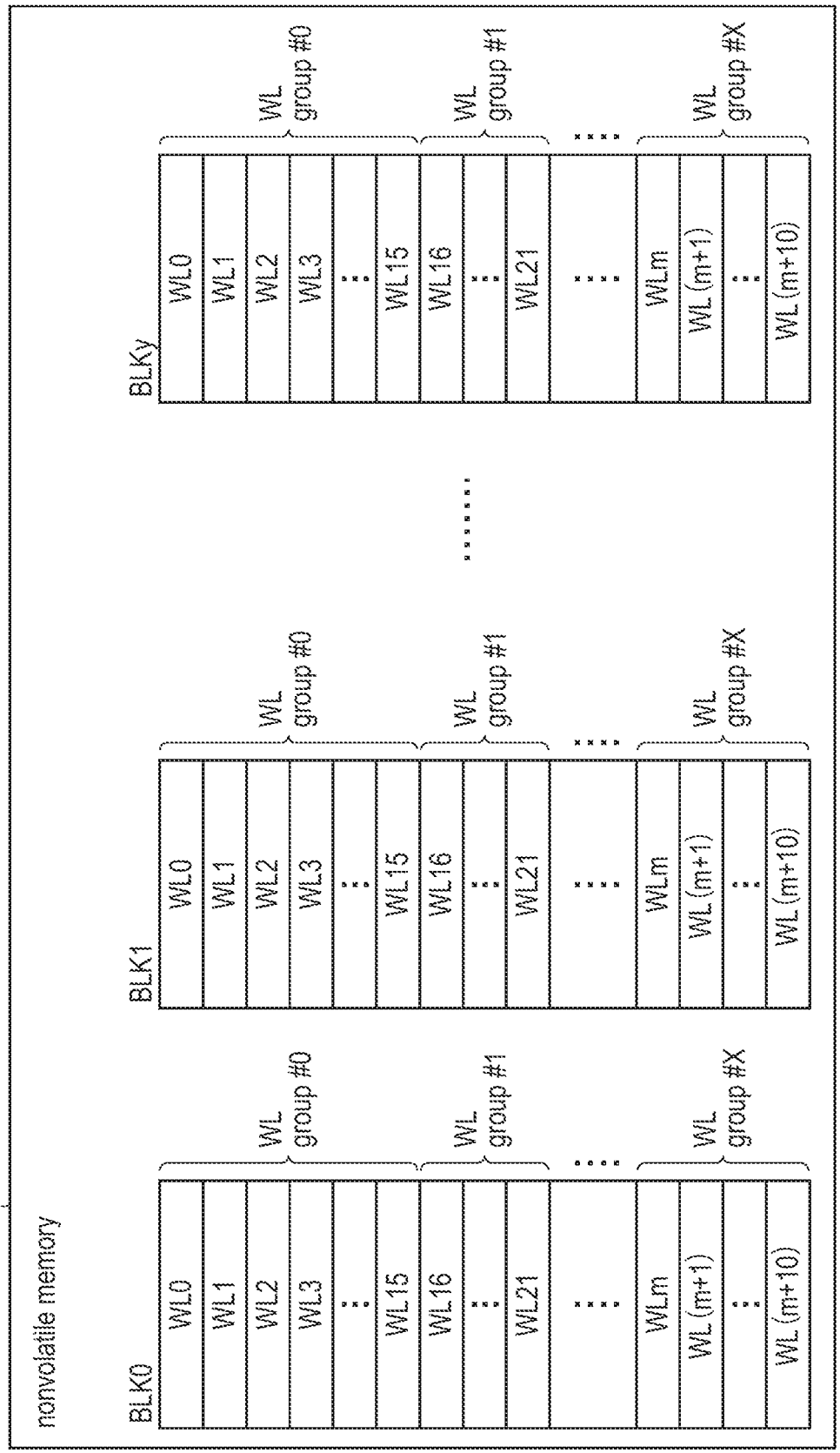
F I G. 2

| word line | WL0 | WL2 | WL30 | WL32 | .... | |
|---|---|---|---|---|---|---|
| number of error bits | a | b | c | d | .... | |

| worst WL group | 0 | 3 | .... | |
|---|---|---|---|---|
| second average number of error bits | a' | c' | .... | |

| second average number of error bits | parameter set identifier | parameter |
|---|---|---|
| second average number of error bits < N1 | parameter set 0 | a0, b0, .. |
| N1 ≤ second average number of error bits < N2 | parameter set 1 | a1, b1, ... |
| ⋮ | ⋮ | ⋮ |
| Nk ≤ second average number of error bits | parameter set k | ak, bk, ... |

75

F I G. 8

| parameter set | amount of reduction in number of error bits | parameter ||||||
|---|---|---|---|---|---|---|---|
| | | A | B | C | D | E | F |
| parameter set 0 | (small) | 1 | -3 | 0 | 0 | 1 | 0 |
| parameter set 1 | | 0 | -2 | 0 | 0 | 0 | 0 |
| parameter set 2 | (medium) | 1 | 0 | 0 | 0 | 0 | 1 |
| parameter set 3 | | 0 | -2 | 0 | 0 | 0 | 1 |
| parameter set 4 | (large) | 1 | -3 | 0 | 0 | 1 | 1 |

F I G. 9

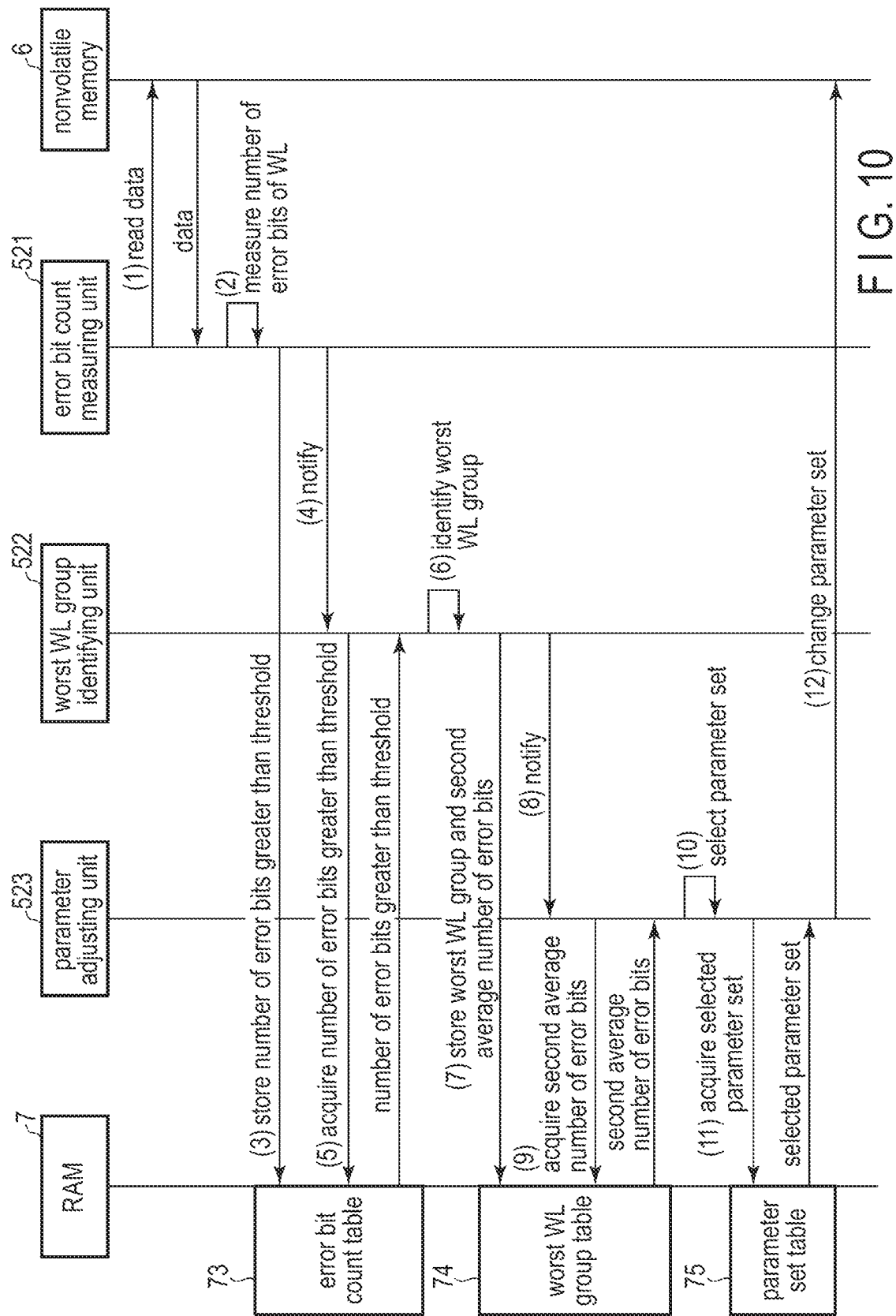
F I G. 10

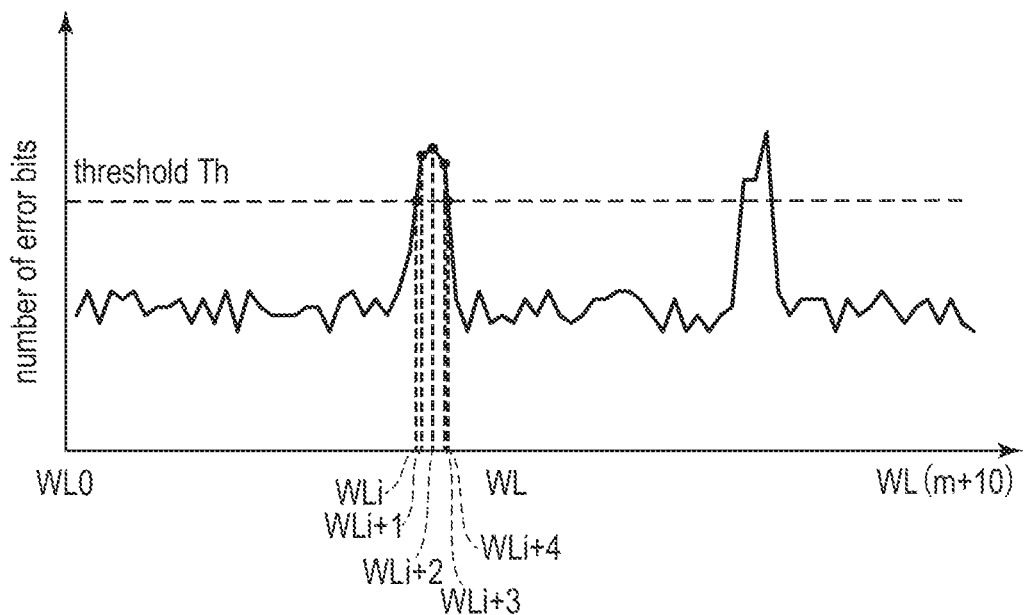
F I G. 14
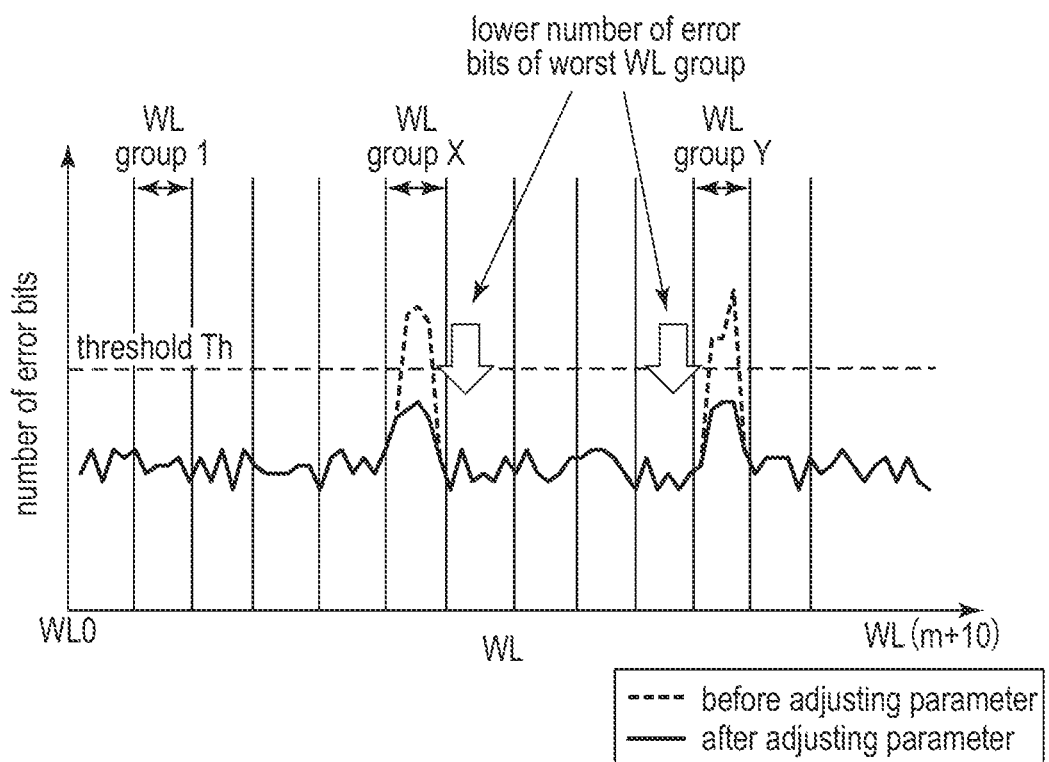
F I G. 15

| worst die | 0 | 0 | 2 | .... | |
|---|---|---|---|---|---|
| worst WL group | 0-0 | 0-3 | 2-0 | .... | |
| second average number of error bits | a' | c' | e' | .... | |

US 12,080,352 B2

MEMORY SYSTEM CONTROLLING NONVOLATILE MEMORY

CROSS-REFERENCE TO RELATED APPLICATIONS

This application is based upon and claims the benefit of priority from Japanese Patent Application No. 2022-045555, filed Mar. 22, 2022, the entire contents of which are incorporated herein by reference.

FIELD

Embodiments described herein relate generally to a memory system that controls a nonvolatile memory.

BACKGROUND

In recent years, memory systems that control nonvolatile memories have been widely used. As such a memory system, a solid-state drive (SSD) that includes a NAND flash memory is known.

In a memory system such as an SSD, a technique for reducing the number of error bits included in data read from a nonvolatile memory is required.

BRIEF DESCRIPTION OF THE DRAWINGS

FIG. 1 is a block diagram illustrating an example of a configuration of an information processing system that includes a memory system according to a first embodiment.

FIG. 2 is a block diagram illustrating an example of an internal configuration of a nonvolatile memory according to the first embodiment.

FIG. 8 is a diagram illustrating an example of a parameter set table managed in the memory system according to the first embodiment.

FIG. 9 is a diagram illustrating an example of a plurality of parameter sets managed in the memory system according to the first embodiment.

FIG. 10 is a sequence diagram illustrating an example of a parameter adjustment operation in the memory system according to the first embodiment.

FIG. 14 is a diagram illustrating an example of the number of error bits of each of a plurality of word lines measured in the parameter adjustment operation in the memory system according to the first embodiment.

FIG. 15 is a diagram illustrating an example of the number of error bits of each of a plurality of word lines when the parameter adjustment operation is executed in the memory system according to the first embodiment.

DETAILED DESCRIPTION

Figure 3:
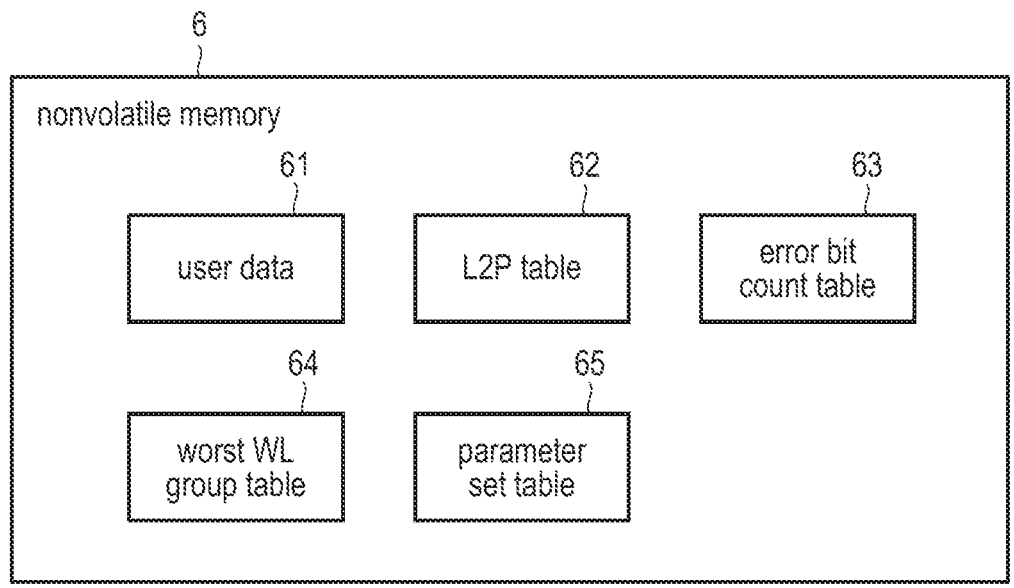
FIG. 3 is a block diagram illustrating an example of data stored in the nonvolatile memory according to the first embodiment.

Various embodiments will be described hereinafter with reference to the accompanying drawings.

In general, according to one embodiment, a memory system comprises a nonvolatile memory and a controller configured to execute writing of data to the nonvolatile memory and reading of data from the nonvolatile memory. The nonvolatile memory includes a plurality of blocks, each of the plurality of blocks being a unit for an erase operation. Each of the plurality of blocks includes a plurality of memory cells connected to each of a plurality of word lines. The controller manages a plurality of word line groups, each of the plurality of word line groups including one or more word lines of the plurality of word lines. Each time the number of program/erase cycles of a first block among the plurality of blocks increases by a first number of times, the controller measures the number of error bits of data read from a plurality of memory cells connected to each of a plurality of word lines of the first block. The controller identifies a first word line group among the plurality of word line groups, the first word line group including a word line corresponding to the number of error bits which is greater than a threshold. The controller calculates an average number of error bits indicating an average of the numbers of error bits of one or more word lines included in the first word line group. The controller selects, based on the average number of error bits of the first word line group, a parameter set to be applied to the first word line group from a plurality of parameter sets, each of the plurality of parameter set defining a program operation of the nonvolatile memory. The controller changes, to the selected parameter set, a parameter set defining the program operation for each of the one or more word lines included in the first word line group of the first block.

First Embodiment

A configuration of an information processing system that includes a memory system according to a first embodiment will be described. FIG. 1 is a block diagram illustrating an example of a configuration of the information processing system that includes the memory system according to the first embodiment. The information processing system 1 includes a host 2 and a memory system 3.

The host 2 is an information processing apparatus. The host 2 is, for example, a personal computer or a server computer. The host 2 accesses the memory system 3. Specifically, the host 2 transmits a write command, which is a command for writing data, to the memory system 3. In addition, the host 2 transmits a read command, which is a command for reading data, to the memory system 3.

The memory system 3 is a storage device. The memory system 3 is, for example, an SSD that includes a NAND flash memory. The memory system 3 writes data in a nonvolatile memory. The memory system 3 reads data from the nonvolatile memory.

The host 2 and the memory system 3 can be connected to each other via a bus 4. Communication between the host 2 and the memory system 3 via the bus 4 is executed in accordance with, for example, an NVM Express™ (NVMe™) standard or a Serial Attached SCSI (SAS) standard. The bus 4 is, for example, a PCI Express™ bus (PCIe™ bus). The bus 4 is mainly used for transmission of an I/O command from the host 2 to the memory system 3 and transmission of a response from the memory system 3 to the host 2. The I/O command is a command for writing or reading data to or from the nonvolatile memory. Examples of the I/O command include a write command and a read command.

Next, an internal configuration of the host 2 will be described. The host 2 includes a processor 21 and a memory 22.

The processor 21 is a central processing unit (CPU). The processor 21 communicates with the memory system 3 via the bus 4. The processor 21 executes software (host software) loaded into the memory 22. The host software is loaded from the memory system 3 into the memory 22, for example. The host software includes an operating system, a file system, a device driver, an application program, and the like.

The memory 22 is a volatile memory. The memory 22 is, for example, a random access memory such as a dynamic random access memory (DRAM).

Next, an internal configuration of the memory system 3 will be described. The memory system 3 includes a controller 5, a nonvolatile memory 6, and a random access memory (RAM) 7.

The controller 5 is a memory controller. The controller 5 is, for example, a control circuit such as a system-on-a-chip (SoC). The controller 5 is communicatively connected to the nonvolatile memory 6. The controller 5 executes writing of data to the nonvolatile memory 6 and reading of data from the nonvolatile memory 6. The controller 5 is communicatively connected to the RAM 7. The controller 5 executes writing of data to the RAM 7 and reading of data from the RAM 7. In addition, the controller 5 executes communication with the host 2 via the bus 4.

The nonvolatile memory 6 is a nonvolatile memory. The nonvolatile memory 6 is, for example, a NAND flash memory. The nonvolatile memory 6 is, for example, a flash memory having a two-dimensional structure or a flash memory having a three-dimensional structure. The nonvolatile memory 6 includes a plurality of blocks. Each of the plurality of blocks is a unit for a data erase operation. The data erase operation is an operation of erasing data stored in a block. The data erase operation is also referred to as an erase operation. Each of the plurality of blocks is also referred to as a physical block, an erase block, a flash block, or a memory block. Each of the plurality of blocks includes a plurality of memory cells connected to each of a plurality of word lines.

The RAM 7 is a volatile memory. The RAM 7 is, for example, a dynamic RAM (DRAM). The RAM 7 temporarily stores, for example, received write data or read data read from the nonvolatile memory 6.

Next, an internal configuration of the controller 5 will be described. The controller 5 includes a host interface circuit 51, a CPU 52, a direct memory access controller (DMAC) 53, an ECC circuit 54, a nonvolatile memory control circuit 55, and a RAM interface circuit 56. The host interface circuit 51, the CPU 52, the DMAC 53, the ECC circuit 54, the nonvolatile memory control circuit 55, and the RAM interface circuit 56 are connected to an internal bus 50.

The host interface circuit 51 is a hardware interface. The host interface circuit 51 executes communication with the host 2. The host interface circuit 51 receives various commands from the host 2. The various commands include, for example, an I/O command.

The CPU 52 is a processor. The CPU 52 controls the host interface circuit 51, the DMAC 53, the ECC circuit 54, the nonvolatile memory control circuit 55, and the RAM interface circuit 56. The CPU 52 loads a control program (firmware) from a ROM (not illustrated) or the nonvolatile memory 6 into the RAM 7. The CPU 52 executes the control program (firmware). The CPU 52 performs various processes based on the control program. For example, the CPU 52 executes management of data stored in the nonvolatile memory 6 and management of the blocks included in the nonvolatile memory 6 as a flash translation layer (FTL). The management of the data stored in the nonvolatile memory 6 is, for example, management of mapping information that is information indicating a correspondence relationship between a logical address and a physical address. The logical address is an address used by the host 2 to access the nonvolatile memory 6. The physical address is an address indicating a physical storage location included in the nonvolatile memory 6. The management of the blocks included in the nonvolatile memory 6 includes, for example, management of a defective block (bad block) included in the nonvolatile memory 6, wear leveling, and garbage collection. The wear leveling is an operation of leveling the numbers of program/erase cycles (P/E cycles) of the blocks.

The DMAC 53 is a circuit that executes direct memory access (DMA). The DMAC 53 transfers data between the memory 22 of the host 2 and the RAM 7.

The ECC circuit 54 is a circuit that encodes data and decodes data. The ECC circuit 54 adds an error correction code (ECC) as a redundant code to data to be written to the nonvolatile memory 6 (ECC encoding). When data is read from the nonvolatile memory 6, the ECC circuit 54 performs error correction on the read data using the ECC added to the read data (ECC decoding).

The nonvolatile memory control circuit 55 is a circuit that controls the nonvolatile memory 6. The nonvolatile memory control circuit 55 is, for example, a circuit that controls a die (nonvolatile memory die).

The RAM interface circuit 56 is a circuit that controls the RAM 7.

Next, an example of an internal configuration of the nonvolatile memory 6 will be described. FIG. 2 is a block diagram illustrating an example of the internal configuration of the nonvolatile memory 6 according to the first embodiment. A case where the number of blocks is y+1 and the number of word lines is m+11 will be described.

The nonvolatile memory 6 includes the y+1 blocks BLK0, BLK1, ..., and BLKy. Each of the blocks BLK0, BLK1, ..., and BLKy includes a plurality of memory cells connected to each of the m+11 word lines WL0, WL1, ..., and WL(m+10).

In addition, each of the m+11 word lines (WL) corresponding to each of the blocks BLK0, BLK1, ..., and BLKy belongs to any of X+1 word line groups (WL groups) which are managed by the controller 5. In this case, X is an integer of 0 or more. The number of word lines included in one WL group is, for example, one or more. Each of the X+1 WL groups includes one word line or two or more word lines physically adjacent to each other. The number of word lines included in one WL group may differ for each WL group. In any block, the m+11 word lines WL0, WL1, ..., WL(m+10) are classified into the X+1 WL groups. For example, the WL group #0 includes 16 word lines WL0, WL1, ..., WL15 physically adjacent to each other. In addition, the WL group #1 includes, for example, six word lines WL16, WL17, ..., WL21 physically adjacent to each other. In addition, the WL group #X includes, for example, 11 word lines WLm, WL(m+1), ..., WL(m+10) physically adjacent to each other.

Next, data stored in the nonvolatile memory 6 will be described. FIG. 3 is a block diagram illustrating an example of the data stored in the nonvolatile memory 6 according to the first embodiment.

The nonvolatile memory 6 stores user data 61, a logical-to-physical address translation table (L2P table) 62, an error bit count table 63, a worst WL group table 64, and a parameter set table 65.

The user data 61 is data to be written to the nonvolatile memory 6 based on a write command received from the host 2.

The L2P table 62 is a table that stores the mapping information. The mapping information is information that indicates the correspondence between each of the logical addresses and each of the physical addresses.

The error bit count table 63 is a table that stores the number of error bits which is greater than a threshold and an identifier of a word line corresponding to the number of error bits which is greater than the threshold.

The worst WL group table 64 is a table that stores an identifier of a worst WL group. The worst WL group is a WL group including a word line corresponding to the number of error bits which is greater than the threshold.

The parameter set table 65 is a table that stores a plurality of parameter sets. Each of the plurality of parameter sets is a parameter set that defines a program operation for the nonvolatile memory 6. Each of the plurality of parameter sets includes a plurality of parameters. A combination of values of the plurality of parameters included in the parameter set is determined by analyzing the relationship between the combination of the values of the parameters and the number of error bits before the shipment of the memory system 3.

Figure 4:
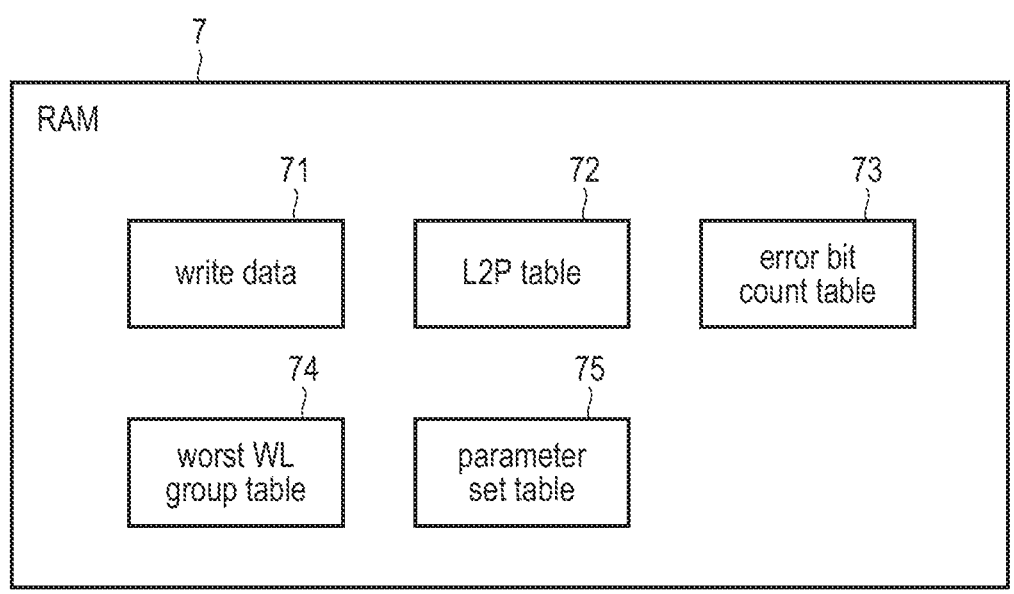
FIG. 4 is a block diagram illustrating an example of data stored in a RAM according to the first embodiment.

Next, data stored in the RAM 7 will be described. FIG. 4 is a block diagram illustrating an example of the data stored in the RAM 7 according to the first embodiment.

The RAM 7 stores write data 71, an L2P table 72, an error bit count table 73, a worst WL group table 74, and a parameter set table 75.

The write data 71 is data temporarily stored in the RAM 7 based on a write command received from the host 2.

The L2P table 72 is a table that stores the same information as a part of the mapping information of the L2P table 62 stored in the nonvolatile memory 6. In addition, each of the error bit count table 73, the worst WL group table 74, and the parameter set table 75 is a table that stores the same information as a part or all of each of the error bit count table 63, the worst WL group table 64, and the parameter set table 65 stored in the nonvolatile memory 6.

Figures 5, 6, 7:
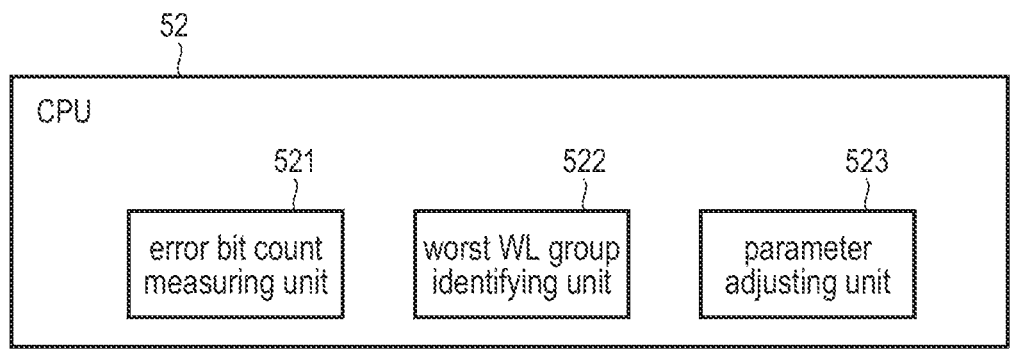
FIG. 5 is a block diagram illustrating an example of a functional configuration of a CPU according to the first embodiment.
FIG. 6 is a diagram illustrating an example of an error bit count table managed in the memory system according to the first embodiment.
FIG. 7 is a diagram illustrating an example of a worst word line group table managed in the memory system according to the first embodiment.

Next, a functional configuration of the CPU 52 will be described. FIG. 5 is a block diagram illustrating an example of the functional configuration of the CPU 52 according to the first embodiment.

The CPU 52 includes an error bit count measuring unit 521, a worst WL group identifying unit 522, and a parameter adjusting unit 523. Some or all of the error bit count measuring unit 521, the worst WL group identifying unit 522, and the parameter adjusting unit 523 may be implemented by other hardware of the controller 5.

The error bit count measuring unit 521 executes an error bit count measuring operation. The error bit count measuring operation is an operation of measuring the number of error bits corresponding to each of the plurality of word lines. In the error bit count measuring operation, the error bit count measuring unit 521 measures the number of error bits corresponding to each of the plurality of word lines WL0, WL1, ..., WL(m+10). The number of error bits is the number of error bits included in data read from a plurality of memory cells connected to each of the word lines. The error bit count measuring unit 521 compares the number of error bits corresponding to each of the word lines WL0, WL1, ..., and WL(m+10) with the threshold, and identifies a word line corresponding to the number of error bits which is greater than the threshold. The error bit count measuring unit 521 measures the number of error bits by, for example, comparing data before error correction by the ECC circuit 54 with data after the error correction by the ECC circuit 54. In a case where the ECC circuit 54 has a function of measuring the number of error bits, the error bit count measuring unit 521 may acquire the number of error bits from the ECC circuit 54 instead of measuring the number of error bits. The error bit count measuring unit 521 executes the error bit count measuring operation based on increase in the number of P/E cycles. For example, each time the number of P/E cycles of a block to be measured increases by a certain number of times, the error bit count measuring unit 521 measures the number of error bits corresponding to each of the word lines (word lines WL0, WL1, ..., WL(m+10)) included in the block to be measured. The block to be measured is a block in which the number of error bits corresponding to each word line is measured among the blocks included in the nonvolatile memory 6. When a plurality of blocks to be measured are present, the error bit count measuring unit 521 calculates an average of the numbers of error bits corresponding to each of the plurality of word lines WL0, WL1, ..., WL(m+10) as a first average number of error bits. The first average number of error bits is an average of the numbers of error bits corresponding to word lines having the same identifier and respectively included in the plurality of blocks to be measured. For example, when a first block and a second block are set as the blocks to be measured, the average of the number of error bits corresponding to the word line WL0 of the first block and the number of error bits corresponding to the word line WL0 of the second block is the first average number of error bits corresponding to the word line WL0. The error bit count measuring unit 521 executes the error bit count measuring operation, for example, immediately after a data writing operation on the nonvolatile memory 6, at the time of idling, at the time of the garbage collection operation, at the time of a refresh operation, at the time of patrol read, or at the time of a read retry.

The worst WL group identifying unit 522 identifies a WL group (worst WL group) including a word line corresponding to the number of error bits which is greater than the threshold. In addition, the worst WL group identifying unit 522 calculates a second average number of error bits. The second average number of error bits is an average of the numbers of error bits corresponding to word lines included in the worst WL group. When a plurality of blocks to be measured are present, the average of the first average numbers of error bits corresponding to the word lines included in the worst WL group is calculated as the second average number of error bits.

The parameter adjusting unit 523 selects a parameter set from the plurality of parameter sets based on the second average number of error bits corresponding to the worst WL group. The parameter adjusting unit 523 changes a parameter set defining the program operation for the worst WL group to the selected parameter set.

Next, the configuration of the error bit count table 73 will be described. FIG. 6 is a diagram illustrating an example of the error bit count table 73 managed in the memory system 3 according to the first embodiment. The error bit count table 73 is a table that stores, for each word line corresponding to the number of error bits which is greater than the threshold, the identifier of the word line and the number of error bits corresponding to the word line.

FIG. 6 illustrates a case where the number of error bits corresponding to each of the word lines WL0, WL2, WL30, WL32, . . . exceeds the threshold. The numbers of error bits of the word lines WL0, WL2, WL30, WL32, . . . are, for example, "a", "b", "c", "d", . . . . In this case, the error bit count table 73 stores a set of the identifier "WL0" of the word line WL0 and a number "a" of error bits of the word line WL0, a set of the identifier "WL2" of the word line WL2 and a number "b" of error bits of the word line WL2, a set of the identifier "WL30" of the word line WL30 and a number "c" of error bits of the word line WL30, and a set of the identifier "WL32" of the word line WL32 and a number "d" of error bits of the word line WL32.

Next, the configuration of the worst WL group table 74 will be described. FIG. 7 is a diagram illustrating an example of the worst WL group table 74 managed in the memory system 3 according to the first embodiment.

The worst WL group table 74 is a table that stores, for each worst WL group, the identifier of the worst WL group and the second average number of error bits.

FIG. 7 illustrates a case where the number of error bits corresponding to each of the word lines WL0, WL2, WL30, WL32, . . . exceeds the threshold. When the word lines WL0 and WL2 are included in a WL group 0 and the word lines WL30 and WL32 are included in a WL group 3, each of the WL group 0 and the WL group 3 is the worst WL group. In this case, the worst WL group table 74 stores a set of the identifier "0" of the WL group 0 and the second average number "a'" of error bits corresponding to the WL group 0 and a set of the identifier "3" of the WL group 3 and a second average number "c'" of error bits corresponding to the WL group 3. The number "a'" is the second average number of error bits corresponding to the worst WL group (WL group 0). The number "c'" is the second average number of error bits corresponding to the worst WL group (WL group 3).

Next, the configuration of the parameter set table 75 will be described. FIG. 8 is a diagram illustrating an example of the parameter set table 75 managed in the memory system 3 according to the first embodiment.

The parameter set table 75 is a table that stores a plurality of parameter sets. The parameter set table 75 includes, for example, k+1 entries corresponding to k+1 parameter sets (parameter sets 0 to k). Each of the k+1 entries includes a "number of error bits" storage area, a "parameter set identifier" storage area, and a "parameter" storage area.

The "number of error bits" storage area of the parameter set 0 stores information indicating a condition for selecting the parameter set 0. The condition for selecting the parameter set 0 is, for example, that the second average number of error bits is less than N1. The "parameter set identifier" storage area of the parameter set 0 stores the identifier of the parameter set 0. The "parameter" storage area of the parameter set 0 stores a plurality of parameters (a0, b0, . . . ) included in the parameter set 0.

The "number of error bits" storage area of the parameter set 1 stores information indicating a condition for selecting the parameter set 1. The condition for selecting the parameter set 1 is, for example, that the second average number of error bits is equal to or larger than N1 and less than N2. In this case, N2 is a numerical value larger than N1. The "parameter set identifier" storage area of the parameter set 1 stores the identifier of the parameter set 1. The "parameter" storage area of the parameter set 1 stores a plurality of parameters (a1, b1, . . . ) included in the parameter set 1.

The "number of error bits" storage area of the parameter set k stores information indicating a condition for selecting the parameter set k. The condition for selecting the parameter set k is, for example, that the second average number of error bits is equal to or larger than Nk. In this case, Nk is a numerical value larger than N2. The "parameter set identifier" storage area of the parameter set k stores the identifier of the parameter set k. The "parameter" storage area of the parameter set k stores a plurality of parameters (ak, bk, . . . ) included in the parameter set k.

Next, a specific example of a parameter set will be described. FIG. 9 is a diagram illustrating a specific example of a parameter set managed in the memory system according to the first embodiment.

In this example, five parameter sets 0 to 4 are managed. Each of the five parameter sets has six parameters corresponding to six types of control operations A to F. The six parameters are values that define a program voltage, a verify operation, the timing of boosting, and the like in the program operation of the nonvolatile memory 6. The parameter defining the program voltage defines the program voltage which is a voltage to be applied to a word line. The parameter defining the program voltage defines, for example, the amplitude of the pulse of the program voltage. The parameter defining the verify operation defines the verify operation that is an operation of verifying whether a threshold voltage of a memory cell has reached a target threshold voltage. The parameter defining the timing of boosting defines the timing of boosting the program voltage. Examples of the parameter defining the timing of boosting include a parameter that defines a boost width (step-up width) of the program voltage and a parameter that defines a pulse width of the program voltage.

The values of the six parameters are determined in advance such that the amount of reduction in the number of error bits differs between the parameter sets 0 to 4. The amount of reduction in the number of error bits is a difference between the number of error bits before parameter adjustment and the number of error bits after the parameter adjustment. The amount of reduction in the number of error bits is, for example, smallest for the parameter set 0 and largest for the parameter set 4. In addition, the program time in a case where the amount of reduction in the number of error bits is changed to a parameter set that is one level larger is equal to or longer than the program time in a case where the amount of reduction in the number of error bits is changed to a parameter set that is one level smaller. The program time is, for example, tPROG. tPROG is a time from the start of the program operation to the completion of the program operation and the verify operation.

Next, the parameter adjustment operation will be described. FIG. 10 is a sequence diagram illustrating an example of the parameter adjustment operation in the memory system according to the first embodiment.

(1) The error bit count measuring unit 521 reads data from each of the plurality of word lines of the block to be measured in the nonvolatile memory 6 each time the number of P/E cycles of each of the plurality of blocks included in the nonvolatile memory 6 increases by a first number of times. The first number of times is, for example, 500 times. The error bit count measuring unit 521 manages, for example, information indicating the number of P/E cycles of the block to be measured. In this case, the error bit count measuring unit 521 reads data from each of the plurality of word lines of the block to be measured each time the number of P/E cycles of the block to be measured increases by the first number of times. When the nonvolatile memory 6 is a QLC-flash memory, the error bit count measuring unit 521 reads data of 16 pages (=4 pages×4 string units) page by page from one word line.

(2) The error bit count measuring unit 521 measures the number of error bits corresponding to each of the plurality of word lines of the block to be measured, by using the read data. The number of error bits is measured, for example, for each of pages or for each of ECC frames (code words). The error bit count measuring unit 521 compares the measured numbers of error bits with the threshold, and identifies the number of error bits which is greater than the threshold. The error bit count measuring unit 521 identifies a word line corresponding to the identified number of error bits.

(3) The error bit count measuring unit 521 stores the identified number of error bits which is greater than the threshold and the identifier of the word line corresponding to the identified number of error bits which is greater than the threshold, in the error bit count table 73 of the RAM 7.

(4) The error bit count measuring unit 521 notifies the worst WL group identifying unit 522 that the process of (3) has ended.

(5) After the error bit count measuring unit 521 notifies the worst WL group identifying unit 522 of the end of the process, the worst WL group identifying unit 522 acquires the number of error bits which is greater than the threshold from the error bit count table 73. Specifically, the worst WL group identifying unit 522 acquires the number of error bits which is greater than the threshold and the identifier of the word line corresponding to the number of error bits which is greater than the threshold from the error bit count table 73.

(6) Upon acquiring the number of error bits which is greater than the threshold and the identifier, the worst WL group identifying unit 522 identifies a WL group (worst WL group) including the word line corresponding to the number of error bits which is greater than the threshold. Upon identifying the worst WL group, the worst WL group identifying unit 522 calculates the second average number of error bits corresponding to the worst WL group.

(7) The worst WL group identifying unit 522 stores the identifier of the worst WL group and the calculated second average number of error bits corresponding to the worst WL group in the worst WL group table 74 of the RAM 7.

(8) The worst WL group identifying unit 222 notifies the parameter adjusting unit 523 that the process of (7) has ended.

(9) After the worst WL group identifying unit 522 notifies the parameter adjusting unit 523 of the end of the process, the parameter adjusting unit 523 acquires the second average number of error bits corresponding to the worst WL group from the worst WL group table 74 of the RAM 7.

(10) The parameter adjusting unit 523 selects a parameter set from the plurality of parameter sets stored in the parameter set table 75 based on the acquired second average number of error bits.

(11) The parameter adjusting unit 523 acquires the selected parameter set from the parameter set table 75 of the RAM 7.

(12) The parameter adjusting unit 523 changes, to the acquired parameter set, a parameter set that defines the program operation for each of the word lines included in the worst WL group of the block to be measured and for each of the word lines included in the worst WL group of the other blocks other than the block to be measured.

Figure 11:
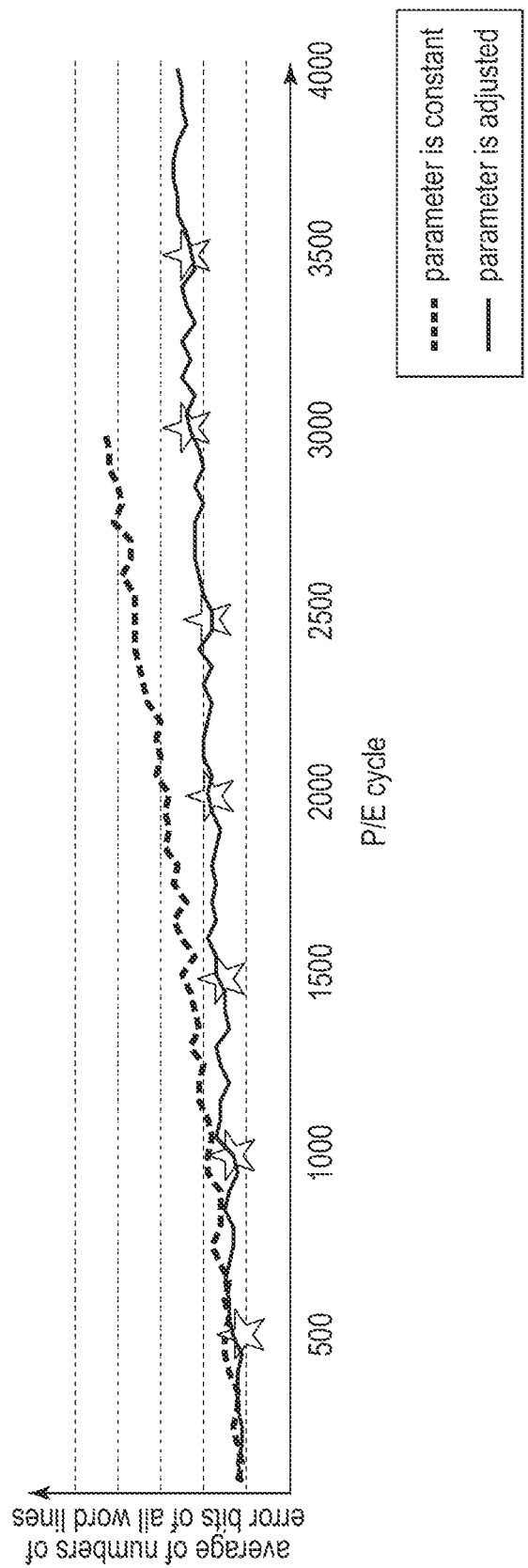
FIG. 11 is a diagram illustrating a relationship between a program/erase cycle and an average number of error bits in the memory system according to the first embodiment.

Next, the parameter adjustment operation will be described. FIG. 11 is a diagram illustrating a relationship between a program/erase cycle and the average of the numbers of error bits in the memory system 3 according to the first embodiment. In FIG. 11, the vertical axis indicates the average of the numbers of error bits corresponding to all the word lines. The horizontal axis indicates, for example, the program/erase cycle of the block to be measured.

A broken line graph in FIG. 11 indicates the average of the numbers of error bits in a case where the parameter that defines the program operation is constant. As the P/E cycle progresses, the average of the numbers of error bits corresponding to all the word lines increases.

A solid line graph in FIG. 11 indicates the average of the numbers of error bits in a case where the parameter that defines the program operation is adjusted. Each star in the drawing indicates the time when the parameter adjustment is executed. When the parameter is adjusted, the degree of increase in the average of the numbers of error bits corresponding to all the word lines is suppressed as compared with the case where the parameter is constant.

Figure 12:
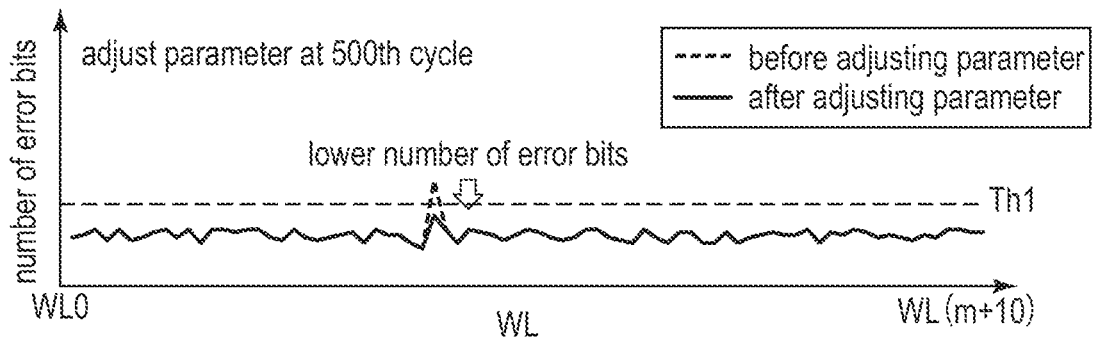
FIG. 12 is a diagram illustrating an example of the number of error bits of each of a plurality of word lines after parameter adjustment of a 500th cycle in the memory system according to the first embodiment.

FIG. 12 is a diagram illustrating an example of the number of error bits of each of the plurality of word lines after parameter adjustment in the 500th cycle in the memory system 3 according to the first embodiment. In FIG. 12, the horizontal axis indicates each of the plurality of word lines (WL0 to WL(m+10)). The vertical axis indicates the number of error bits corresponding to each of the plurality of word lines. The number of error bits indicated by a broken line is a threshold Th1.

A broken line graph in FIG. 12 indicates the number of error bits corresponding to each of the word lines WL0 to WL(m+10) and measured when the P/E cycle reaches the 500th cycle. The parameter adjustment is executed on a word line corresponding to the number of error bits which is greater than the threshold Th1 among the measured numbers of error bits.

A solid line graph in FIG. 12 indicates the number of error bits corresponding to each of the word lines WL0 to WL(m+10) after the parameter adjustment is executed. The number of error bits corresponding to each of the word lines on which the parameter adjustment has been executed is lowered.

Figure 13:
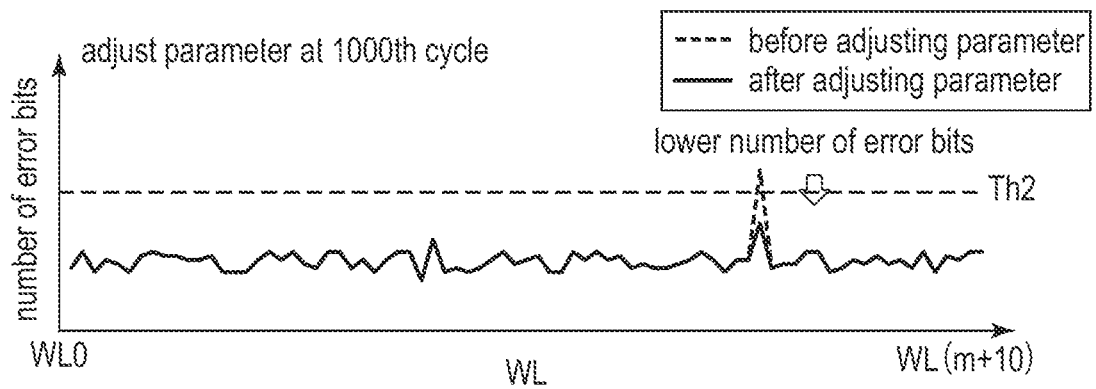
FIG. 13 is a diagram illustrating an example of the number of error bits of each of a plurality of word lines after parameter adjustment of a 1000th cycle in the memory system according to the first embodiment.

FIG. 13 is a diagram illustrating an example of the number of error bits of each of the plurality of word lines after parameter adjustment in the 1000th cycle in the memory system 3 according to the first embodiment. In FIG. 13, the horizontal axis indicates each of the plurality of word lines (WL0 to WL(m+10)). The vertical axis indicates the number of error bits corresponding to each of the plurality of word lines. The number of error bits indicated by a broken line is a threshold Th2.

A broken line graph in FIG. 13 indicates the number of error bits corresponding to each of the word lines WL0 to WL(m+10) and measured when the P/E cycle reaches the 1000th cycle. The parameter adjustment is executed on a word line corresponding to the number of error bits which is greater than the threshold Th2 among the measured numbers of error bits.

A solid line graph in FIG. 13 indicates the number of error bits corresponding to each of the word lines WL0 to WL(m+10) after the parameter adjustment is executed. The number of error bits corresponding to each of the word lines on which the parameter adjustment has been executed is lowered.

FIG. 14 is a diagram illustrating an example of the number of error bits of each of the plurality of word lines measured in the parameter adjustment operation in the memory system 3 according to the first embodiment. In FIG. 14, the horizontal axis indicates each of the plurality of word lines (WL0 to WL(m+10)). The vertical axis indicates the number of error bits corresponding to each of the plurality of word lines. The number of error bits indicated by a broken line is a threshold Th.

A solid line graph in FIG. 14 indicates the number of error bits corresponding to each of the plurality of word lines. The number of error bits corresponding to a word line WLi matches the threshold. The number of error bits corresponding to each of the word lines WLi+1 to WLi+3 exceeds the threshold. The number of error bits corresponding to the word line WLi+4 matches the threshold. In this case, the three word lines WLi+1 to WLi+3 are identified as word lines each corresponding to the number of error bits which is greater than the threshold.

FIG. 15 is a diagram illustrating an example of the number of error bits of each of the plurality of word lines when the parameter adjustment operation is executed in the memory system 3 according to the first embodiment. In FIG. 15, the horizontal axis indicates each of the plurality of word lines (WL0 to WL(m+10)). The vertical axis indicates the number of error bits corresponding to each of the plurality of word lines. The number of error bits indicated by a broken line is the threshold Th.

A broken line graph in FIG. 15 indicates the number of error bits corresponding to each of the plurality of word lines before the parameter adjustment. In FIG. 15, the number of error bits corresponding to each of one or more word lines of word lines included in a WL group X and the number of error bits corresponding to each of one or more word lines of word lines included in a WL group Y exceed the threshold. Each of the WL group X and the WL group Y is identified as the worst WL group.

A solid line graph in FIG. 15 indicates the number of error bits corresponding to each of the plurality of word lines after the parameter adjustment is executed on the identified WL groups X and Y. The number of error bits corresponding to each of the plurality of word lines included in the WL group X and the number of error bits corresponding to each of the plurality of word lines included in the WL group Y after the parameter adjustment is executed are values that are lower than the number of error bits before the parameter adjustment and lower than the threshold.

Figure 16:
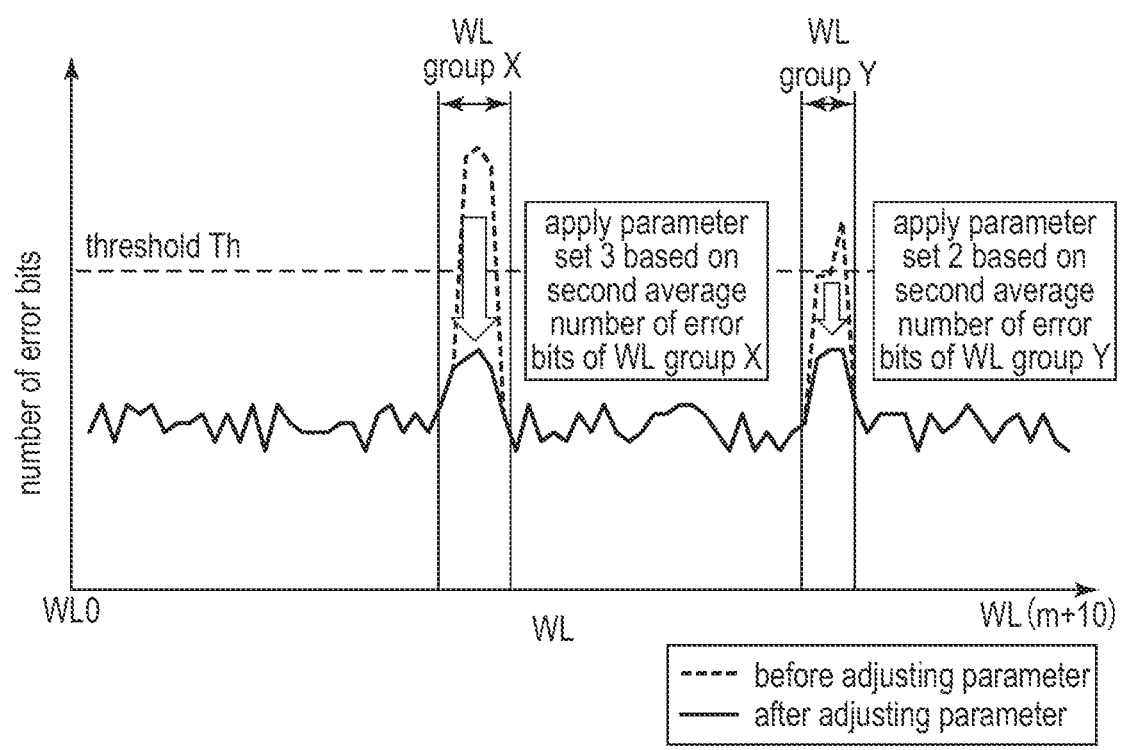
FIG. 16 is a diagram illustrating an example of the number of error bits when a new parameter set is applied to each of two word line groups in the memory system according to the first embodiment.

FIG. 16 is a diagram illustrating an example of the number of error bits when a parameter set that defines the program operation for each of two word line groups is changed to a new parameter set in the memory system 3 according to the first embodiment. In FIG. 16, the horizontal axis indicates each of the plurality of word lines (WL0 to WL(m+10)). The vertical axis indicates the number of error bits corresponding to each of the plurality of word lines.

A broken line graph in FIG. 16 indicates the number of error bits corresponding to each of the plurality of word lines before the parameter adjustment. In this case, it is assumed that each of the WL group X and the WL group Y is a WL groups including a word line corresponding to the number of error bits which is greater than the threshold. Each of the WL group X and the WL group Y is identified as the worst WL group. The second average number of error bits corresponding to the WL group X and the second average number of error bits corresponding to the WL group Y are calculated. Then, the parameter set 3 is selected based on the second average number of error bits corresponding to the WL group X. In addition, the parameter set 2 is selected based on the second average number of error bits corresponding to the WL group Y. The number of error bits indicated by a broken line is the threshold Th.

The second average number of error bits corresponding to the WL group X belongs to the range of the second average number of error bits corresponding to the parameter set 3. The parameter set defining the program operation for the WL group X is changed to the parameter set 3.

On the other hand, the second average number of error bits corresponding to the WL group Y belongs to the range of the second average number of error bits corresponding to the parameter set 2. The parameter set defining the program operation for the WL group Y is changed to the parameter set 2.

A solid line graph in FIG. 16 indicates the number of error bits corresponding to each of the plurality of word lines after the parameter adjustment is executed. The number of error bits corresponding to each of the word lines included in the WL group X for which the parameter set has been changed to the parameter set 3 is reduced more significantly than the number of error bits corresponding to each of the word lines included in the WL group Y for which the parameter set has been changed to the parameter set 2. For example, the number of error bits corresponding to each of the word lines included in the WL group X and the number of error bits corresponding to each of the word lines included in the WL group Y are substantially the same value.

Figure 17:
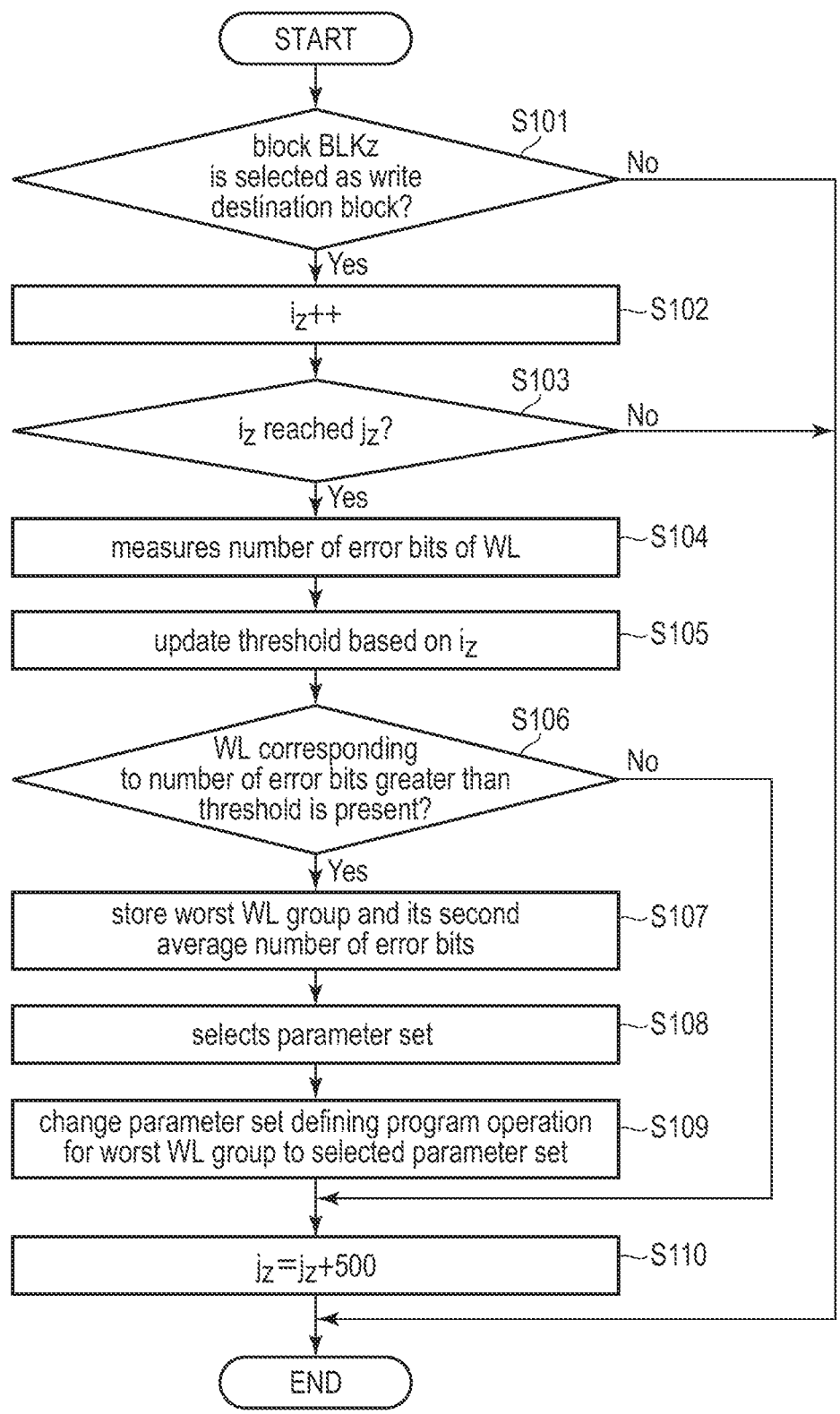
FIG. 17 is a flowchart illustrating a procedure of the parameter adjustment operation executed in the memory system according to the first embodiment.

Next, a procedure of the parameter adjustment operation will be described. FIG. 17 is a flowchart illustrating the procedure of the parameter adjustment operation executed in the memory system 3 according to the first embodiment. The parameter adjustment operation will be described focusing on one block BLKz to be measured.

When a block is selected as a new write destination block (start), the controller 5 determines whether the block BLKz to be measured is selected as a new write destination block (S101). The write destination block is, for example, a block to which data associated with a write command is written or a movement destination block to which data is moved by an internal operation such as the garbage collection operation.

When the block BLKz is not selected as the new write destination block (No in S101), the controller 5 ends the parameter adjustment operation (end). The controller 5 waits until the block BLKz is selected as the new write destination block.

When the block BLKz is selected as the new write destination block (Yes in S101), the controller 5 executes the erase operation on the block BLKz. Then, the controller 5 increments a number iz of program/erase cycles of the block BLKz by 1 (S102). The initial value of iz is 0.

The controller 5 determines whether the number iz of program/erase cycles of the block BLKz has reached a number jz of times (S103). The initial value of jz is, for example, 500. jz is a multiple of 500 such as 500, 1000, 1500 . . . .

When the number iz of program/erase cycles has not reached the number jz of times (No in S103), the controller 5 ends the parameter adjustment operation (end).

When the number iz of program/erase cycles has reached the number jz of times (Yes in S103), the controller 5 measures the number of error bits corresponding to each of the word lines WL0, WL1, . . . , WL(m+10) of the block BLKz (S104). When a plurality of blocks to be measured are present, the controller 5 measures the number of error bits corresponding to each of the word lines WL0, WL1, . . . , and WL(m+10) for each of the plurality of blocks to be measured. The P/E cycle of each of the blocks progresses to the same extent by the wear leveling. Therefore, when the block BLKz reaches the P/E cycle at which the parameter adjustment is executed, it can be expected that the other blocks to be measured also reach the P/E cycle at which the parameter adjustment is performed.

The controller 5 updates the threshold based on the number iz of program/erase cycles (S105). For example, the controller 5 updates the threshold such that the threshold becomes larger as the number iz of program/erase cycles increases. The number of error bits of each of the plurality of word lines increases as the number iz of P/E cycles increases. When the threshold is constant, the number of word lines corresponding to the number of error bits which is greater than the threshold increases as the number iz of P/E cycles increases. In this case, the parameter adjustment is executed on many word lines. However, when the threshold is updated to a higher value based on the increase in the number iz of P/E cycles, the parameter adjustment is executed on a word line corresponding to a particularly high number of error bits.

The controller 5 determines whether a word line corresponding to the number of error bits which is greater than the threshold is present (S106). The controller 5 compares the number of error bits corresponding to each of the word lines WL0, WL1, . . . , and WL(m+10) with the threshold. Based on the comparison results, the controller 5 identifies a word line corresponding to the number of error bits which is greater than the threshold among the word lines WL0, WL1, . . . , and WL(m+10). Upon identifying the word line corresponding to the number of error bits which is greater than the threshold, the controller 5 identifies a WL group including the word line corresponding to the number of error bits which is greater than the threshold as the worst WL group. When the number of error bits corresponding to each of the word lines WL0, WL1, . . . , and WL(m+10) included in each of the plurality of blocks to be measured is measured, the controller 5 compares the first average number of error bits of each of the word lines WL0, WL1, . . . , and WL(m+10) with the threshold.

When the word line corresponding to the number of error bits which is greater than the threshold is present (Yes in S106), the controller 5 stores an identifier indicating a WL group (worst WL group) including the word line corresponding to the number of error bits which is greater than the threshold and the second average number of error bits corresponding to the worst WL group, in the worst WL table 74 (S107). The controller 5 calculates the second average number of error bits corresponding to the worst WL group. The controller 5 stores an identifier indicating the worst WL group and the second average number of error bits corresponding to the worst WL group in the worst WL table 74.

The controller 5 selects a parameter set based on the stored second average number of error bits (S108). The controller 5 selects the parameter set corresponding to the second average number of error bits corresponding to the worst WL group from the parameter set table 75.

The controller 5 changes a parameter set defining the program operation for the worst WL group to the selected parameter set (S109). In this case, the controller 5 uses the selected parameter set during the program operation for each of the word lines included in the worst WL group of the block BLKz. In addition, the controller 5 can change a parameter set defining the program operation for each of the word lines included in the worst WL group of each of all the blocks other than the block BLKz to the selected parameter set.

When the word line corresponding to the number of error bits which is greater than the threshold is not present (No in S106), the controller 5 omits the procedure of S107 to S109.

The controller 5 increments the value of the number jz of times by 500 (S110).

The controller 5 ends the parameter adjustment operation (end). At this time, the values of iz and jz are maintained. Then, the controller 5 waits until the block BLKz is selected again as the write destination block.

As described above, in the memory system 3 according to the first embodiment, each time the number of P/E cycles increases by a certain number of times, a WL group including a word line corresponding to the number of error bits which is greater than the threshold is identified. Then, a parameter set defining the program operation for each word line included in the identified WL group is changed to a new parameter set selected based on the second average number of error bits corresponding to the identified WL group. Therefore, the number of error bits corresponding to each word line included in the identified WL group can be reduced. As a result, it is possible to suppress an increase in the number of error bits of the entire nonvolatile memory 6.

Second Embodiment

Figure 18:
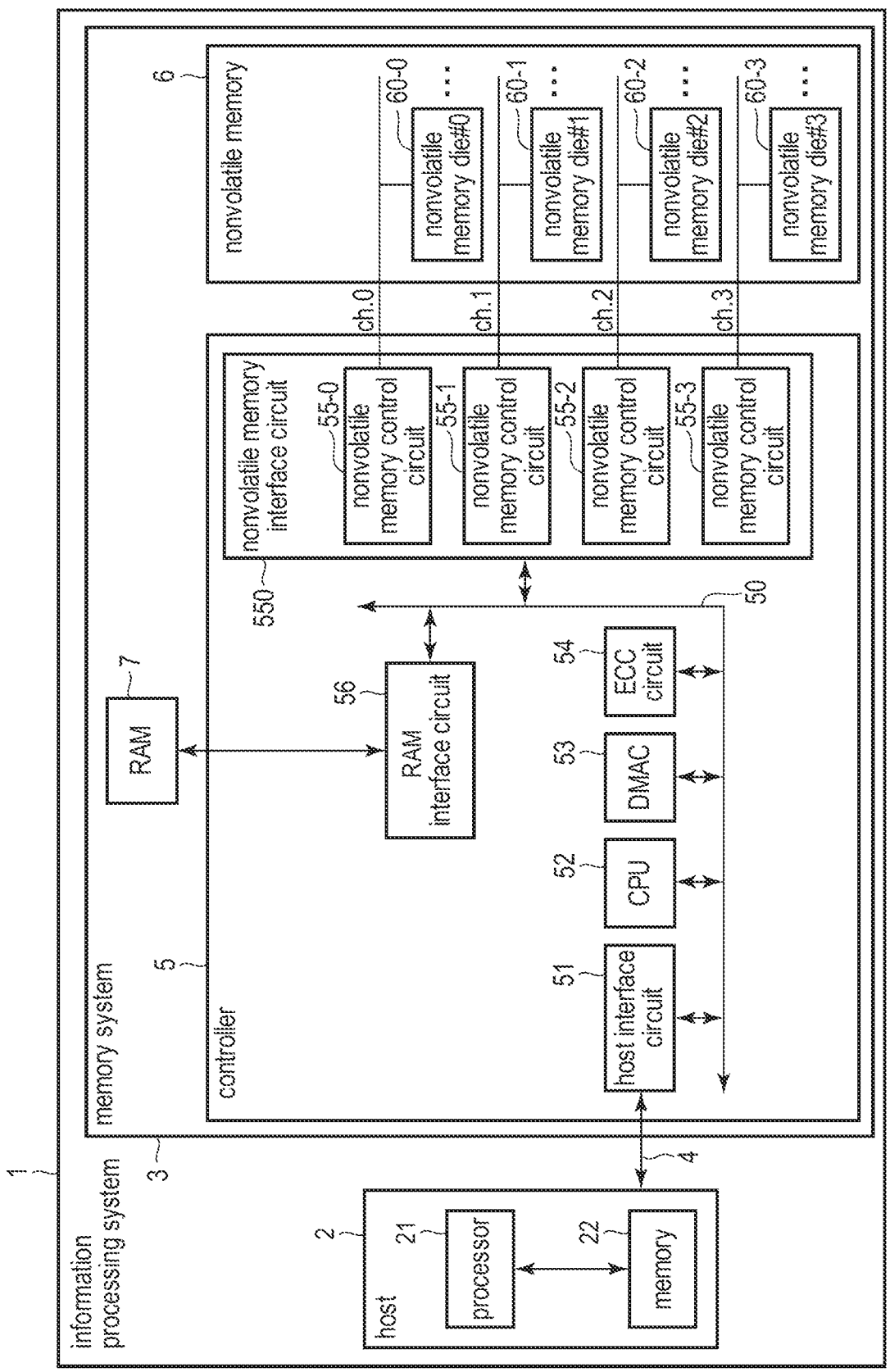
FIG. 18 is a block diagram illustrating an example of a configuration of an information processing system including a memory system according to a second embodiment.

Next, a memory system according to a second embodiment will be described. In the memory system according to the second embodiment, the nonvolatile memory 6 included in the memory system 3 according to the first embodiment has a plurality of dies (nonvolatile memory dies). Each of the plurality of dies includes a plurality of blocks. Each of the plurality of blocks has the same configuration as the configuration of each of the blocks described with reference to FIG. 2. FIG. 18 is a block diagram illustrating an example of a configuration of an information processing system 1 including the memory system 3 according to the second embodiment. A description will be given focusing on parts different from the memory system 3 according to the first embodiment.

A controller 5 includes a nonvolatile memory interface circuit 550. The nonvolatile memory interface circuit 550 is a circuit that controls the nonvolatile memory 6. The nonvolatile memory interface circuit 550 includes, for example, nonvolatile memory control circuits 55-0, 55-1, 55-2, and 55-3. The nonvolatile memory control circuits 55-0, 55-1, 55-2, and 55-3 are connected to channels ch.0, ch.1, ch.2, and ch.3, respectively. In a case where the nonvolatile memory 6 includes a plurality of dies, each of the nonvolatile memory control circuits 55-0, 55-1, 55-2, and 55-3 is connected to one or more dies via a corresponding channel. For example, the nonvolatile memory control circuit 55-0 is connected to a die 60-0 via the channel ch.0. The nonvolatile memory control circuit 55-1 is connected to a die 60-1 via the channel ch.1. The nonvolatile memory control circuit 55-2 is connected to a die 60-2 via the channel ch.2. The nonvolatile memory control circuit 55-3 is connected to a die 60-3 via the channel ch.3.

Figure 19:
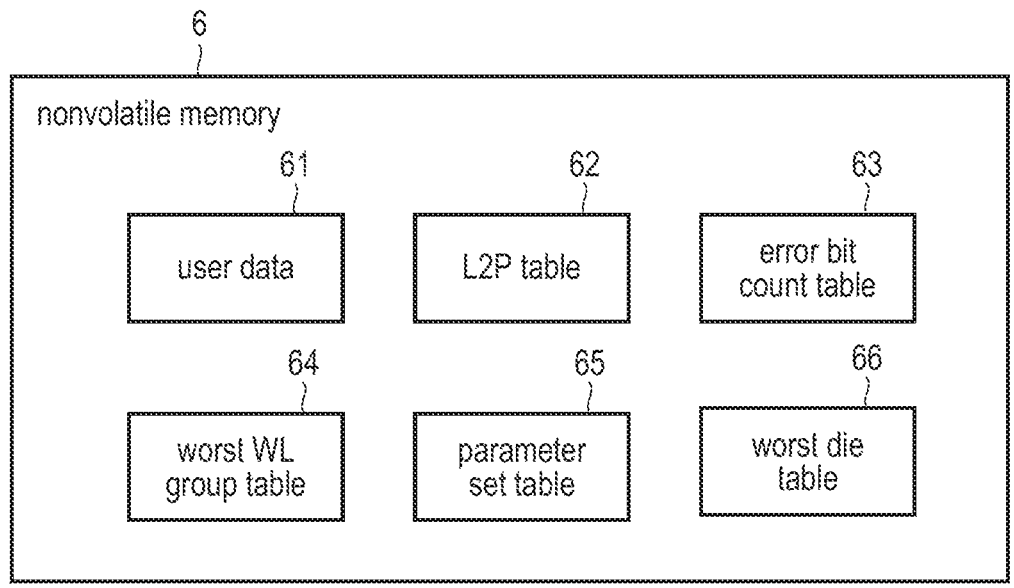
FIG. 19 is a block diagram illustrating an example of data stored in a nonvolatile memory according to the second embodiment.

Next, data stored in the nonvolatile memory 6 will be described. FIG. 19 is a block diagram illustrating an example of data stored in the nonvolatile memory 6 according to the second embodiment.

The nonvolatile memory 6 further stores a worst die table 66 in addition to the user data 61, the logical-to-physical address translation table (L2P table) 62, the error bit count table 63, the worst WL group table 64, and the parameter set table 65.

The worst die table 66 is a table that stores information regarding a worst die. The worst die is a nonvolatile memory die including one or more worst WL groups. The worst die table 66 stores the identifier of the worst die, an identifier of the worst WL group, and the second average number of error bits corresponding to the worst WL group as information regarding the worst die.

Figure 20:
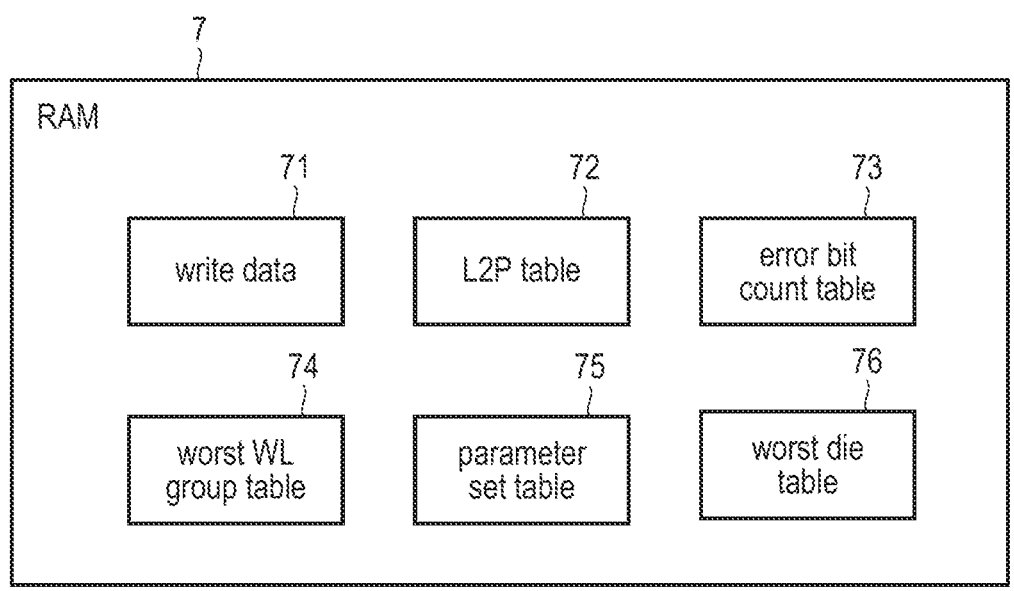
FIG. 20 is a block diagram illustrating an example of data stored in a RAM according to the second embodiment.

Next, data stored in a RAM 7 will be described. FIG. 20 is a block diagram illustrating an example of data stored in the RAM 7 according to the second embodiment.

The RAM 7 further stores a worst die table 76 in addition to the write data 71, the L2P table 72, the error bit count table 73, the worst WL group table 74, and the parameter set table 75.

The worst die table 76 is a table that stores all or a part of the information of the worst die table 66 stored in the nonvolatile memory 6.

Figures 21, 22:
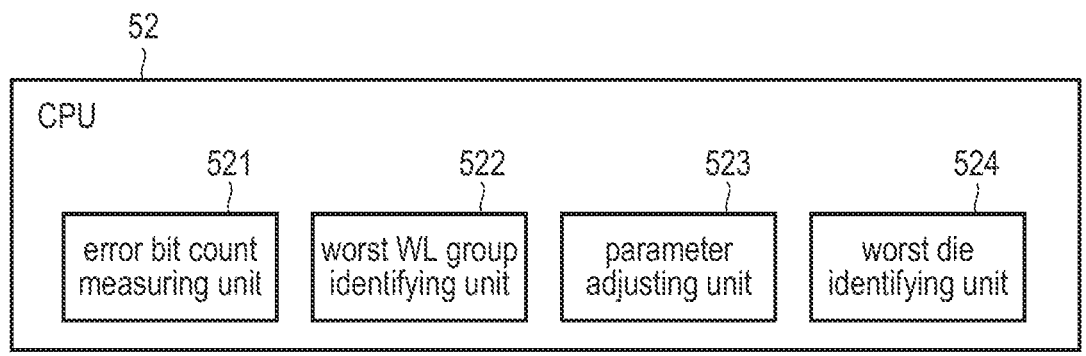
FIG. 21 is a block diagram illustrating an example of a functional configuration of a CPU according to the second embodiment.
FIG. 22 is a diagram illustrating an example of a worst die table managed in the memory system according to the second embodiment.

Next, a functional configuration of a CPU 52 will be described. FIG. 21 is a block diagram illustrating an example of the functional configuration of the CPU 52 according to the second embodiment.

The CPU 52 further includes a worst die identifying unit 524 in addition to the error bit count measuring unit 521, the worst WL group identifying unit 522, and the parameter adjusting unit 523.

The worst die identifying unit 524 identifies a nonvolatile memory die including a worst WL group. The worst die identifying unit 524 identifies the die that includes the worst WL group identified by the worst WL group identifying unit 522 as the worst die.

Next, the configuration of the worst die table 76 will be described. FIG. 22 is a diagram illustrating an example of the worst die table 76 managed in the memory system 3 according to the second embodiment.

The worst die table 76 is a table that stores, for each of worst dies, the identifier of the worst die, an identifier of each of one or more worst WL groups included in the worst die, and the second average number of error bits corresponding to each of the one or more worst WL groups.

FIG. 22 illustrates a case where a WL group 0-0, a WL group 0-3, and a WL group 2-0 are the worst WL groups. The WL group 0-0 and WL group 0-3 are included in a die having an identifier "0". In addition, the WL group 2-0 is included in a die having an identifier "2". The second average numbers of error bits of the WL group 0-0, the WL group 0-3, and the WL group 2-0 are "a'", "c'", and "e'".

Figure 23:
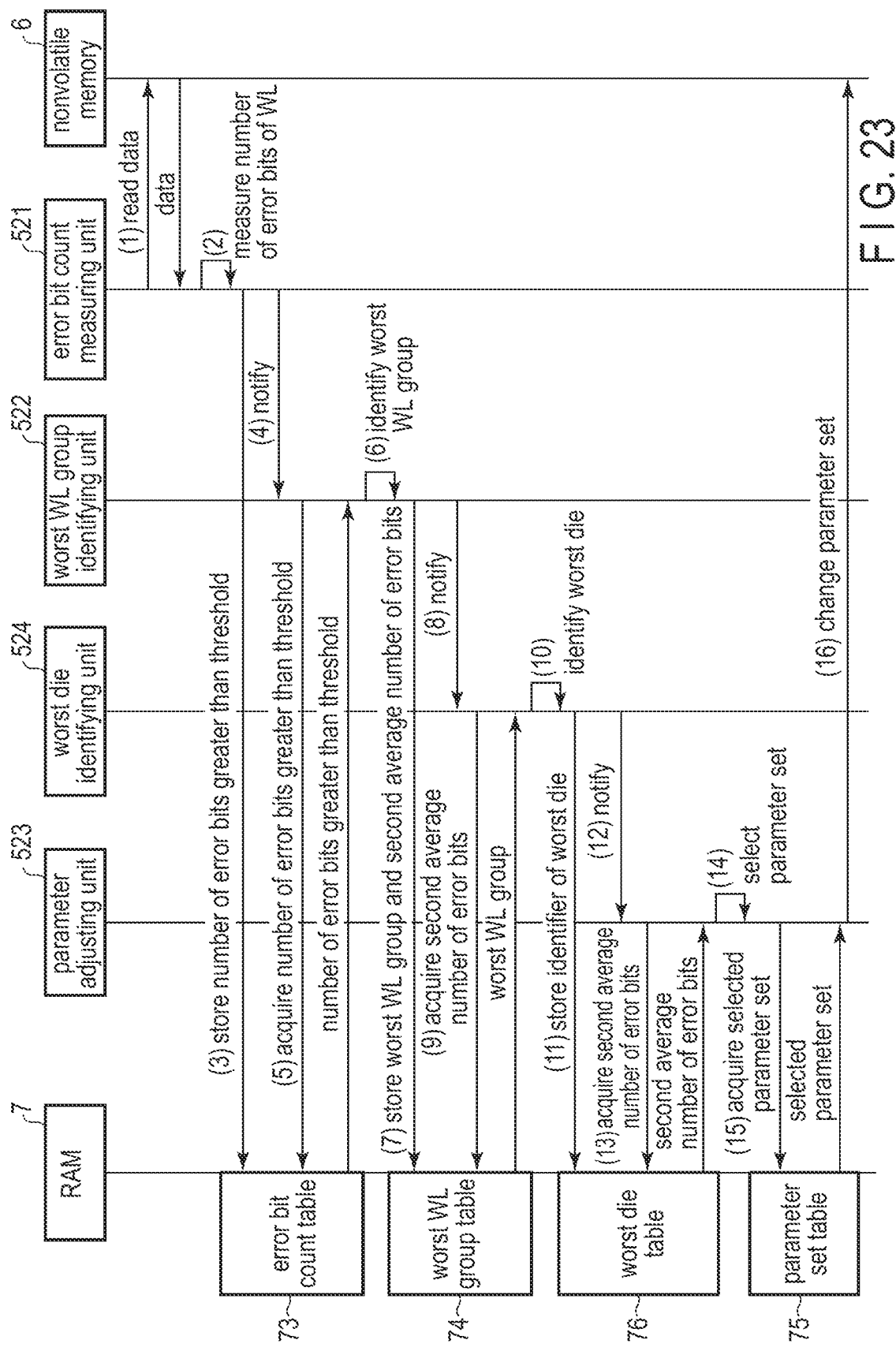
FIG. 23 is a sequence diagram illustrating an example of a parameter adjustment operation in the memory system according to the second embodiment.

Next, a parameter adjustment operation will be described. FIG. 23 is a sequence diagram illustrating an example of the parameter adjustment operation according to the second embodiment.

(1) Each time the number of P/E cycles of each of the plurality of blocks included in each of the plurality of dies increases by a first number of times, the error bit count measuring unit 521 reads data from each of the word lines WL0, WL1, . . . , and WL(m+10) of a block that is to be measured and is included in each of the plurality of dies. For example, each time the P/E cycle of a block that is to be measured and is included in each of the plurality of dies increases by the first number of times, the error bit count measuring unit 521 reads data from each of the word lines WL0, WL1, . . . , WL(m+ 10) of the block that is to be measured and is included in each of the plurality of dies.

(2) The error bit count measuring unit 521 measures the number of error bits corresponding to each of the plurality of word lines of the block to be measured, by using the read data. The error bit count measuring unit 521 compares the measured numbers of error bits with the threshold, and identifies the number of error bits which is greater than the threshold. The error bit count measuring unit 521 identifies a word line corresponding to the identified number of error bits.

(3) The error bit count measuring unit 521 stores the identified number of error bits which is greater than the threshold and the identifier of the word line corresponding to the Identified number of error bits which is greater than the threshold, in the error bit count table 73 of the RAM 7. For example, the error bit count table 73 is provided for each die. For example, it is assumed that the number of error bits corresponding to any one of the word lines WL0, WL1, . . . , and WL(m+10) included in a block that is to be measured and is included in a first die exceeds the threshold. In this case, the error bit count measuring unit 521 stores the number of error bits which is greater than the threshold and the identifier of the word line corresponding to the number of error bits which is greater than the threshold in the error bit count table 73 corresponding to the first die. In addition, it is assumed that the number of error bits corresponding to any one of the word lines WL0, WL1, . . . , and WL(m+10) included in a block that is to be measured and is included in a second die exceeds the threshold. In this case, the error bit count measuring unit 521 stores the number of error bits which is greater than the threshold and the identifier of the word line corresponding to the number of error bits which is greater than the threshold in the error bit count table 73 corresponding to the second die.

(4) The error bit count measuring unit 521 notifies the worst WL group identifying unit 522 that the process of (3) has ended.

(5) After the error bit count measuring unit 521 notifies the worst WL group identifying unit 522 of the end of the process, the worst WL group identifying unit 522 acquires the number of error bits which is greater than the threshold from the error bit count table 73. Specifically, the worst WL group identifying unit 522 acquires the number of error bits which is greater than the threshold and the identifier of the word line corresponding to the number of error bits which is greater than the threshold from the error bit count table 73.

(6) Upon acquiring the number of error bits which is greater than the threshold and the identifier, the worst WL group identifying unit 522 identifies a WL group (worst WL group) including the word line corresponding to the number of error bits which is greater than the threshold. Upon identifying the worst WL group, the worst WL group identifying unit 522 calculates the second average number of error bits corresponding to the worst WL group. For example, it is assumed that the block to be measured and including the word line corresponding to the number of error bits which is greater than the threshold is a block that is to be measured and is included in the first die among the plurality of dies. In this case, the worst WL group identifying unit 522 calculates the second average number of error bits corresponding to the worst WL group based on the number of error bits corresponding to each of the word lines included in the worst WL group of the block that is to be measured and is included in the first die. In addition, it is assumed that the block to be measured and including the word line corresponding to the number of error bits which is greater than the threshold is a block that is to be measured and is included in the second die among the plurality of dies. In this case, the worst WL group identifying unit 522 calculates the second average number of error bits corresponding to the worst WL group based on the number of error bits corresponding to each of the word lines included in the worst WL group of the block that is to be measured and is included in the second die.

(7) After calculating the second average number of error bits corresponding to the worst WL group, the worst WL group identifying unit 522 stores the identifier of the worst WL group and the second average number of error bits corresponding to the worst WL group in the worst WL group table 74 of the RAM 7.

(8) The worst WL group identifying unit 522 notifies the worst die identifying unit 524 that the process of (7) has ended.

(9) After the worst WL group identifying unit 522 notifies the worst die identifying unit 524 of the end of the process, the worst die identifying unit 524 acquires the identifier of the worst WL group from the worst WL group table 74 of the RAM 7.

(10) The worst die identifying unit 524 identifies a die (nonvolatile memory die) including the worst WL group as the worst die.

(11) The worst die identifying unit 524 stores the identifier of the worst die, the identifier of the worst WL group included in the worst die, and the second average number of error bits corresponding to the worst WL group in the worst die table 76 of the RAM 7.

(12) The worst die identifying unit 524 notifies the parameter adjusting unit 523 that the process of (11) has ended.

(13) After the worst die identifying unit 524 notifies the parameter adjusting unit 523 that the process has ended, the parameter adjusting unit 523 acquires the identifier of the worst die, the identifier of the worst WL group, and the second average number of error bits from the worst die table 76 of the RAM 7.

(14) The parameter adjusting unit 523 selects a parameter set from the plurality of parameter sets stored in the parameter set table 75 based on the acquired second average number of error bits.

(15) The parameter adjusting unit 523 acquires the selected parameter set from the parameter set table 75 of the RAM 7.

(16) The parameter adjusting unit 523 changes, to the acquired parameter set, a parameter set defining the program operation for the worst WL group of each of the plurality of blocks included in the worst die.

Figure 24:
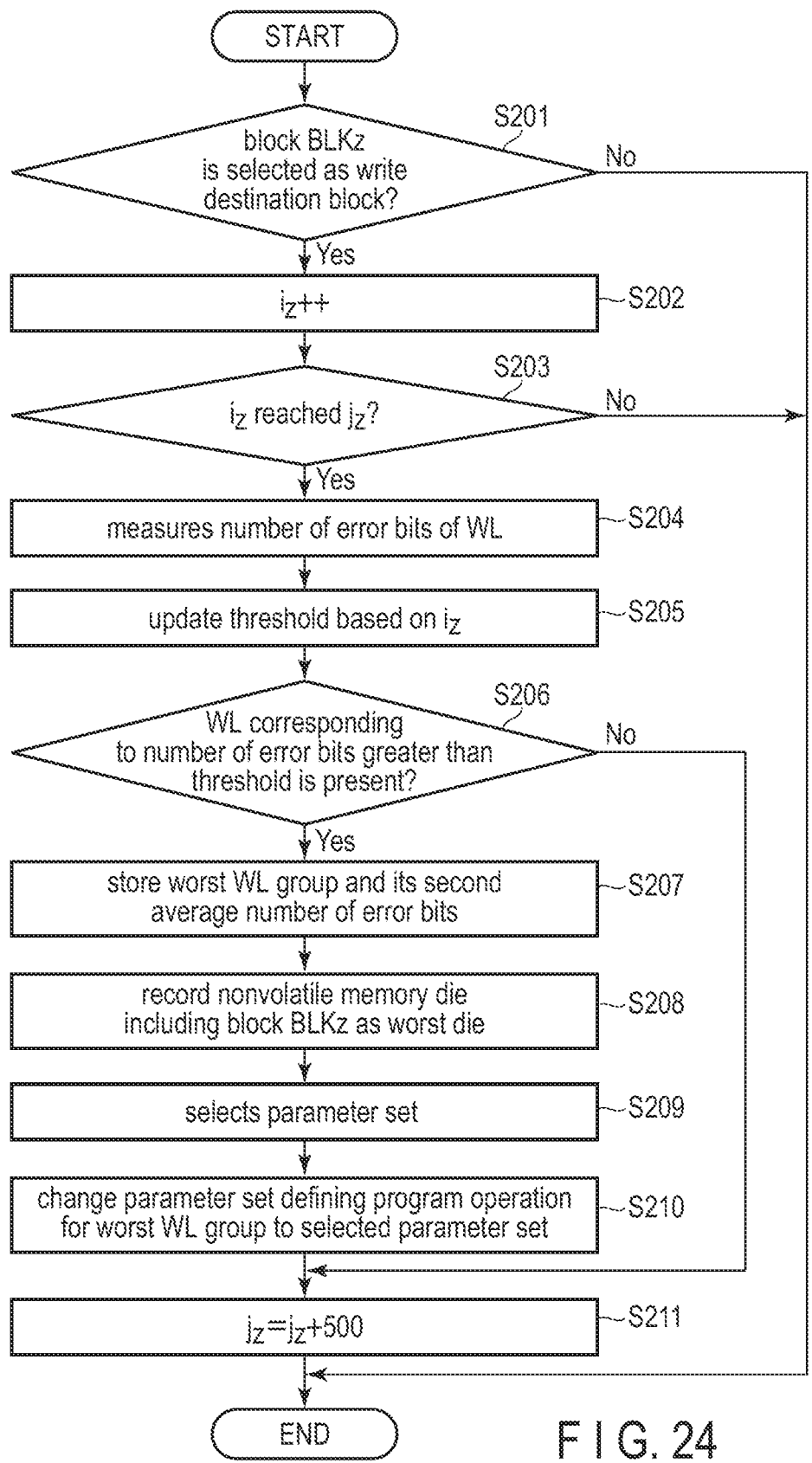
FIG. 24 is a flowchart illustrating a procedure of the parameter adjustment operation executed in the memory system according to the second embodiment.

Next, a procedure of the parameter adjustment operation will be described. FIG. 24 is a flowchart illustrating the procedure of the parameter adjustment operation executed in the memory system 3 according to the second embodiment. The parameter adjustment operation will be described focusing on one block BLKz to be measured.

When a block is selected as a new write destination block (start), the controller 5 determines whether the block BLKz to be measured is selected as a new write destination block (S201).

When the block BLKz is not selected as the new write destination block (No in S201), the controller 5 ends the parameter adjustment operation (end). The controller 5 waits until the block BLKz is selected as the new write destination block.

When the block BLKz is selected as the new write destination block (Yes in S201), the controller 5 executes the erase operation on the block BLKz. Then, the controller 5 increments a number iz of program/erase cycles of the block BLKz by 1 (S202).

The controller 5 determines whether the number iz of program/erase cycles of the block BLKz has reached the number jz of times (S203).

When the number iz of program/erase cycles has not reached the number jz of times (No in S203), the controller 5 ends the parameter adjustment operation (end).

When the number iz of program/erase cycles has reached the number jz of times (Yes in S203), the controller 5 measures the number of error bits corresponding to each of the word lines WL0, WL1, . . . , WL(m+10) of the block BLKz (S204). At this time, the controller 5 measures the number of error bits corresponding to each of the word lines WL0, WL1, . . . , WL(m+10) of a block that is to be measured and is included in each of the plurality of dies.

The controller 5 updates the threshold based on the number iz of program/erase cycles (S205).

The controller 5 determines whether a word line corresponding to the number of error bits which is greater than the threshold is present (S206). The controller 5 compares the number of error bits corresponding to each of the word lines WL0, WL1, . . . , and WL(m+10) with the threshold. The controller 5 identifies a WL group including the word line corresponding to the number of error bits which is greater than the threshold as the worst WL group.

When the word line corresponding to the number of error bits which is greater than the threshold is present (Yes in S206), the controller 5 stores an identifier indicating the worst WL group and the second average number of error bits corresponding to the worst WL group in the worst WL table 74 (S207). The controller 5 calculates the second average number of error bits corresponding to the worst WL group. The controller 5 stores the identifier indicating the worst WL group and the calculated second average number of error bits in the worst WL table 74.

The controller 5 stores the identifier of the nonvolatile memory die including the block BLKz in the worst die table 76 as the identifier of the worst die (S208). In this case, the block BLKz is a block including the worst WL group. Therefore, the nonvolatile memory die including the block BLKz is the worst die. In addition, the controller 5 stores the identifier indicating the worst WL group and the second average number of error bits corresponding to the worst WL group in the worst die table 76.

The controller 5 selects a parameter set (S209). The controller 5 selects the parameter set based on the second average number of error bits corresponding to the worst WL group stored in the worst die table 76.

The controller 5 changes, to the selected parameter set, a parameter set defining the program operation for the word line included in the worst WL group of each of the plurality of blocks included in the worst die (S210). A parameter set that defines the program operation for another die other than the worst die is not changed to the selected parameter set. Note that the controller 5 may change only the parameter set defining the program operation for the worst WL group of the block BLKz of the worst die to the selected parameter set.

When the worst WL group is not present (No in S206), the controller 5 omits the procedure of S207 to S210.

The controller 5 increments the value of the number jz of times by 500 (S211).

The controller 5 ends the parameter adjustment operation (end). At this time, the values of iz and jz are maintained. Then, the controller 5 waits until the block BLKz is selected again as the write destination block.

As described above, according to the second embodiment, the controller 5 can execute the parameter adjustment operation on the worst WL group included in the worst die among the plurality of dies.

Therefore, the parameter adjustment can be executed on the worst WL group included in the die having lower quality than the other dies. The low-quality die is a die having a larger number of error bits than the other dies. As a result, the controller 5 can suppress an increase in the number of error bits of the entire nonvolatile memory 6 including the plurality of dies.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory system comprising:
a nonvolatile memory; and
a controller configured to execute writing of data to the nonvolatile memory and reading of data from the nonvolatile memory, wherein
the nonvolatile memory includes a plurality of blocks, each of the plurality of blocks being a unit for an erase operation,
each of the plurality of blocks includes a plurality of memory cells connected to each of a plurality of word lines, and
the controller is configured to:
manage a plurality of word line groups, each of the plurality of word line groups including one or more word lines of the plurality of word lines; and
each time the number of program/erase cycles of a first block among the plurality of blocks increases by a first number of times:
measure the number of error bits of data read from a plurality of memory cells connected to each of a plurality of word lines of the first block;
identify a first word line group among the plurality of word line groups, the first word line group including a word line corresponding to the number of error bits which is greater than a threshold;
calculate an average number of error bits indicating an average of the numbers of error bits of one or more word lines included in the first word line group;
select, based on the average number of error bits of the first word line group, a parameter set to be applied to the first word line group from a plurality of parameter sets, each of the plurality of parameter set defining a program operation of the nonvolatile memory; and
change, to the selected parameter set, a parameter set defining the program operation for each of the one or more word lines included in the first word line group of the first block.

2. The memory system according to claim 1, wherein the controller is further configured to:
select a first parameter set from the plurality of parameter sets when the average number of error bits of the first word line group is greater than the threshold and less than a first value greater than the threshold;
select a second parameter set from the plurality of parameter sets when the average number of error bits of the first word line group is greater than or equal to the first value and less than a second value greater than the first value; and
select a third parameter set from the plurality of parameter sets when the average number of error bits of the first word line group is greater than or equal to the second value and less than a third value greater than the second value.

3. The memory system according to claim 1, wherein the controller is further configured to increase the threshold as the program/erase cycle progresses.

4. The memory system according to claim 1, wherein each of the plurality of word line groups includes one word line or two or more word lines adjacent to each other.

5. The memory system according to claim 1, wherein each of the plurality of parameter sets includes at least a parameter indicating a program voltage to be applied to a word line, a parameter defining a verify operation, and a parameter defining a timing of boosting the program voltage.

6. A memory system comprising:
a nonvolatile memory including a plurality of dies; and
a controller configured to execute writing of data to the nonvolatile memory and reading of data from the nonvolatile memory, wherein each of the plurality of dies includes a plurality of blocks,
each of the plurality of blocks is a unit for an erase
operation,
each of the plurality of blocks includes a plurality of
memory cells connected to each of a plurality of word
lines, and
the controller is configured to:
manage a plurality of word line groups, each of the
plurality of word line group including one or more
word lines among the plurality of word lines; and
each time the number of program/erase cycles of each of
the plurality of blocks included in each of the plurality
of dies increases by a first number of times:
measure the number of error bits of data read from a
plurality of memory cells connected to each of a
plurality of word lines of a block that is to be
measured and is included in each of the plurality of
dies;
identify a first word line group and a first die including
the first word line group, the first word line group
being among the plurality of word line groups, the
first word line group including a word line corresponding to the number of error bits which is greater
than a threshold;
calculate an average number of error bits indicating an
average of the numbers of error bits of one or more
word lines included in the first word line group of the
first die;
select, based on the average number of error bits of the
first word line group, a parameter set to be applied to
the first word line group from a plurality of parameter sets each defining a program operation of the
nonvolatile memory; and
change, to the selected parameter set, a parameter set
defining the program operation for the first word line
group of each of a plurality of blocks included in the
first die.

7. The memory system according to claim 6, wherein
the controller is further configured to:
select a first parameter set from the plurality of parameter
sets when the average number of error bits of the first
word line group of the first die is greater than the
threshold and less than a first value greater than the
threshold;
select a second parameter set from the plurality of parameter sets when the average number of error bits of the
first word line group of the first die is greater than or
equal to the first value and less than a second value
greater than the first value; and
select a third parameter set from the plurality of parameter
sets when the average number of error bits of the first
word line group of the first die is greater than or equal
to the second value and less than a third value greater
than the second value.

8. The memory system according to claim 6, wherein the
controller is further configured to increase the threshold as
the program/erase cycle of each of the plurality of blocks
included in each of the plurality of dies progresses.

9. The memory system according to claim 6, wherein each
of the plurality of word line groups includes one word line
or two or more word lines adjacent to each other.

10. The memory system according to claim 6, wherein
each of the plurality of parameter sets includes at least a
parameter indicating a program voltage to be applied to a
word line, a parameter defining a program verify operation,
and a parameter defining a timing of boosting the program
voltage.

* * * * *